United States Patent [19]
Chappell et al.

[11] Patent Number: 5,926,487
[45] Date of Patent: Jul. 20, 1999

[54] HIGH PERFORMANCE REGISTERS FOR PULSED LOGIC

[75] Inventors: Terry Ivan Chappell, Portland, Oreg.; Michael Kevin Ciraula, Round Rock, Tex.; Max Eduardo De Ycaza, Raleigh, N.C.; Sang Hoo Dhong, Austin, Tex.; Rudolf Adriaan Haring, Cortlandt Manor, N.Y.; Talal Kamel Jaber, Austin, Tex.; Mark Samson Milshtein, Hillsboro, Oreg.; Pho Hoang Nguyen, Round Rock; Edward Seewann, Austin, both of Tex.

[73] Assignee: International Business Machines Corporation, Armonk, N.Y.

[21] Appl. No.: 08/583,297

[22] Filed: Jan. 5, 1996

[51] Int. Cl.$^6$ .................................................. G01R 31/28
[52] U.S. Cl. ........................................ 371/22.31; 327/202
[58] Field of Search ................................ 371/22.3, 22.5, 371/62, 22.31, 22.32, 22.36; 327/198–202, 205, 206, 208–215, 241; 395/183.06; 326/83, 86, 115, 98

[56] References Cited

U.S. PATENT DOCUMENTS

| | | | |
|---|---|---|---|
| 5,434,519 | 7/1995 | Trinh et al. ............................. | 326/83 |
| 5,488,319 | 1/1996 | Lo ........................................... | 326/115 |
| 5,524,114 | 6/1996 | Peng ....................................... | 371/22.1 |
| 5,528,601 | 6/1996 | Schmookler ........................... | 371/22.3 |
| 5,576,651 | 11/1996 | Phillips .................................. | 327/202 |
| 5,614,838 | 3/1997 | Jaber et al. ............................ | 324/765 |
| 5,617,426 | 4/1997 | Koenemann et al. ................. | 371/22.3 |

*Primary Examiner*—Robert W. Beausoliel, Jr.
*Assistant Examiner*—Nadeem Iqbac

[57] ABSTRACT

A high performance register that can be used as a pipelined register in logic chips that are designed using a pulsed logic methodology is described. The register features minimal setup time, pulse catching and pulse launching. The register circuitry complies with and implements a circuit-level test methodology for pulsed logic that features the ability to inhibit the reset of pulses, to force resets and to operate the circuits in a pseudo static mode. The register also complies with the level sensitive scan design (LSSD) methodology. Also described is a state-holding static master-slave register that complies with a pulsed logic design methodology, the register exhibiting an automatic power reduction feature and a simplified modular register bit design which can easily be adapted to either static domino or pulsed logic. The register is also LSSD compliant. Also described is the means and method for allowing static transmission gate input registers to comply with the static evaluate test mode. The automatic power reduction feature can be extended to downstream logic.

46 Claims, 21 Drawing Sheets

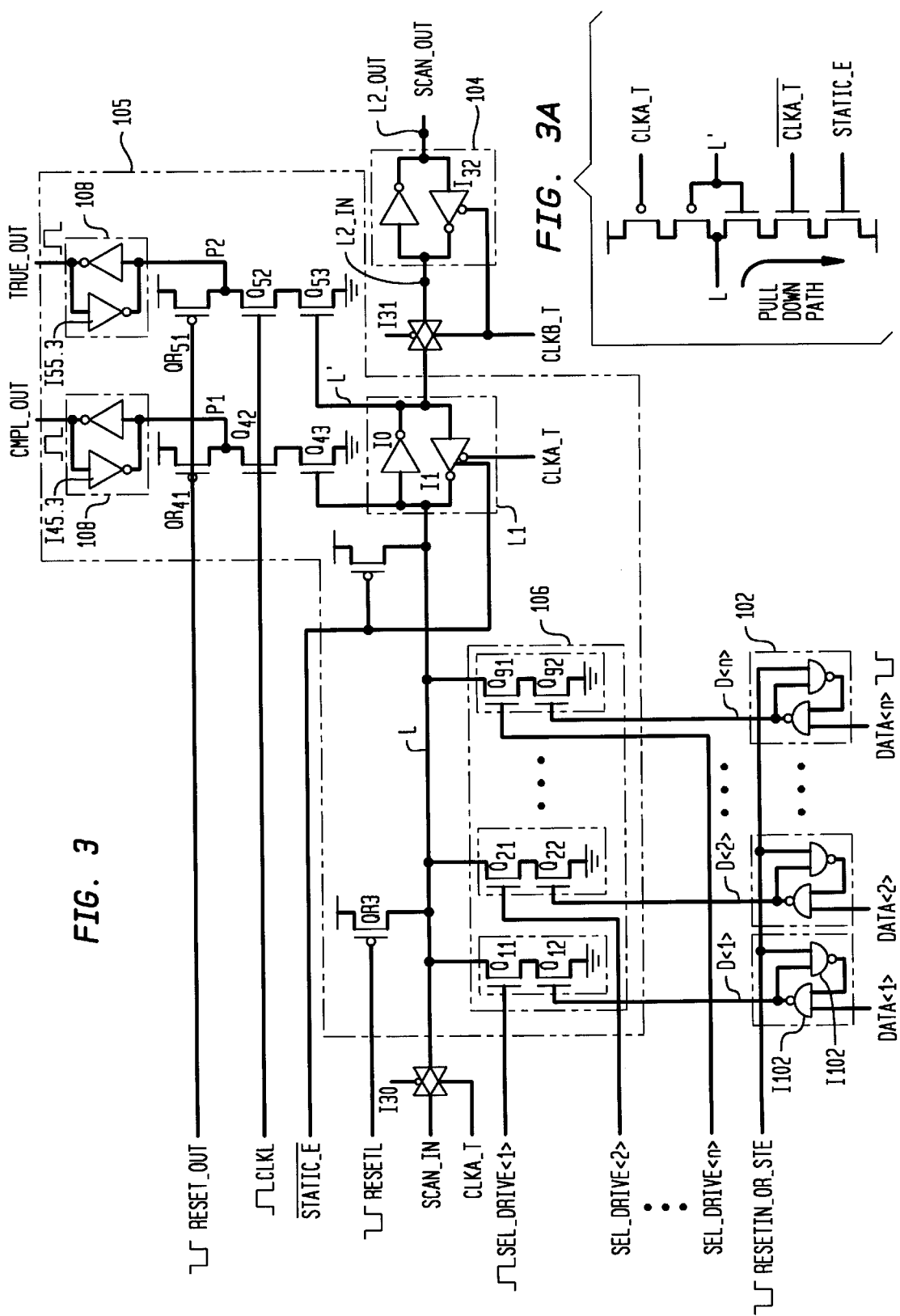

FUNCTIONAL MODE

STATIC_EVALUATE MODE

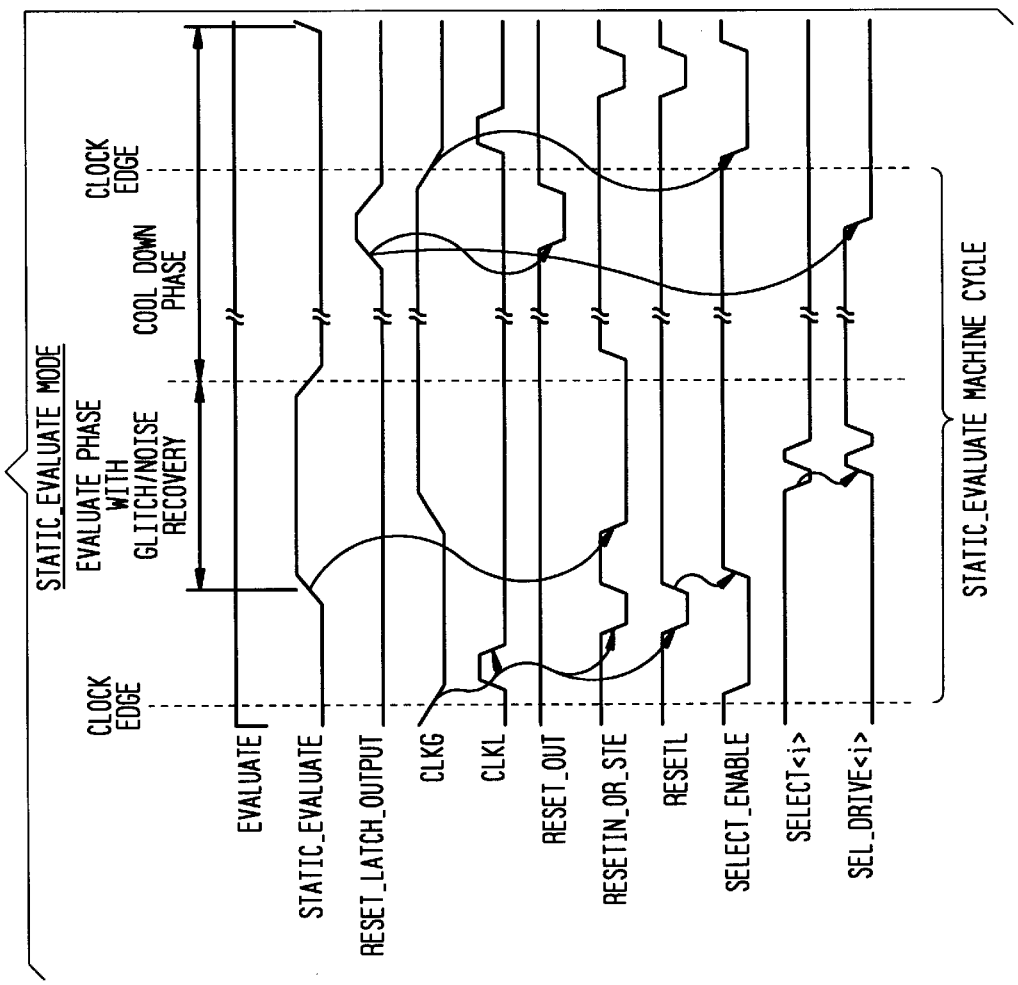
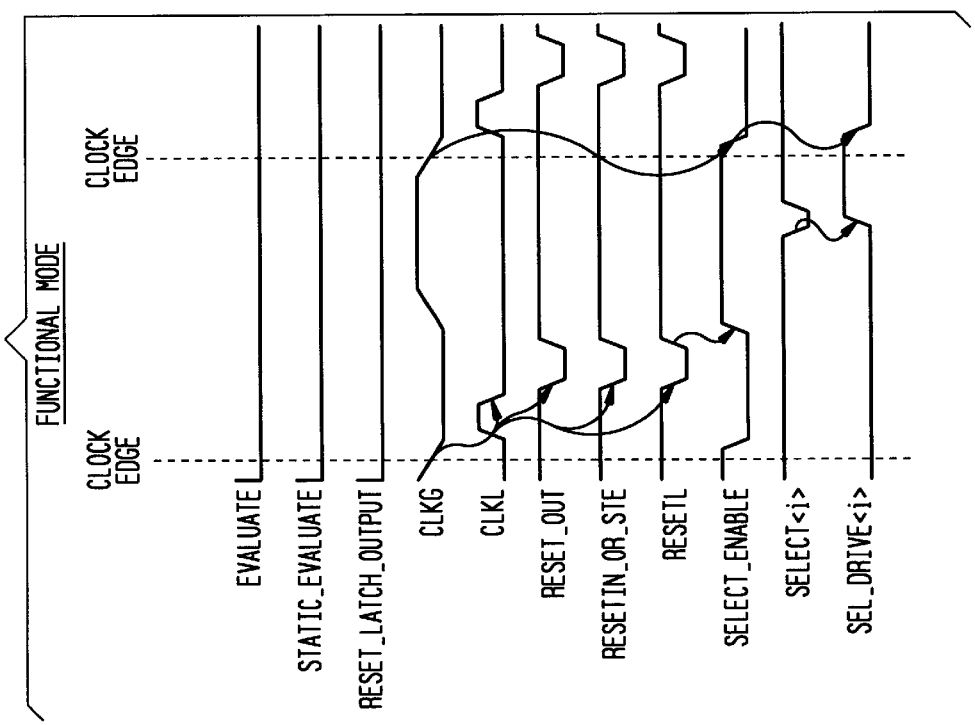

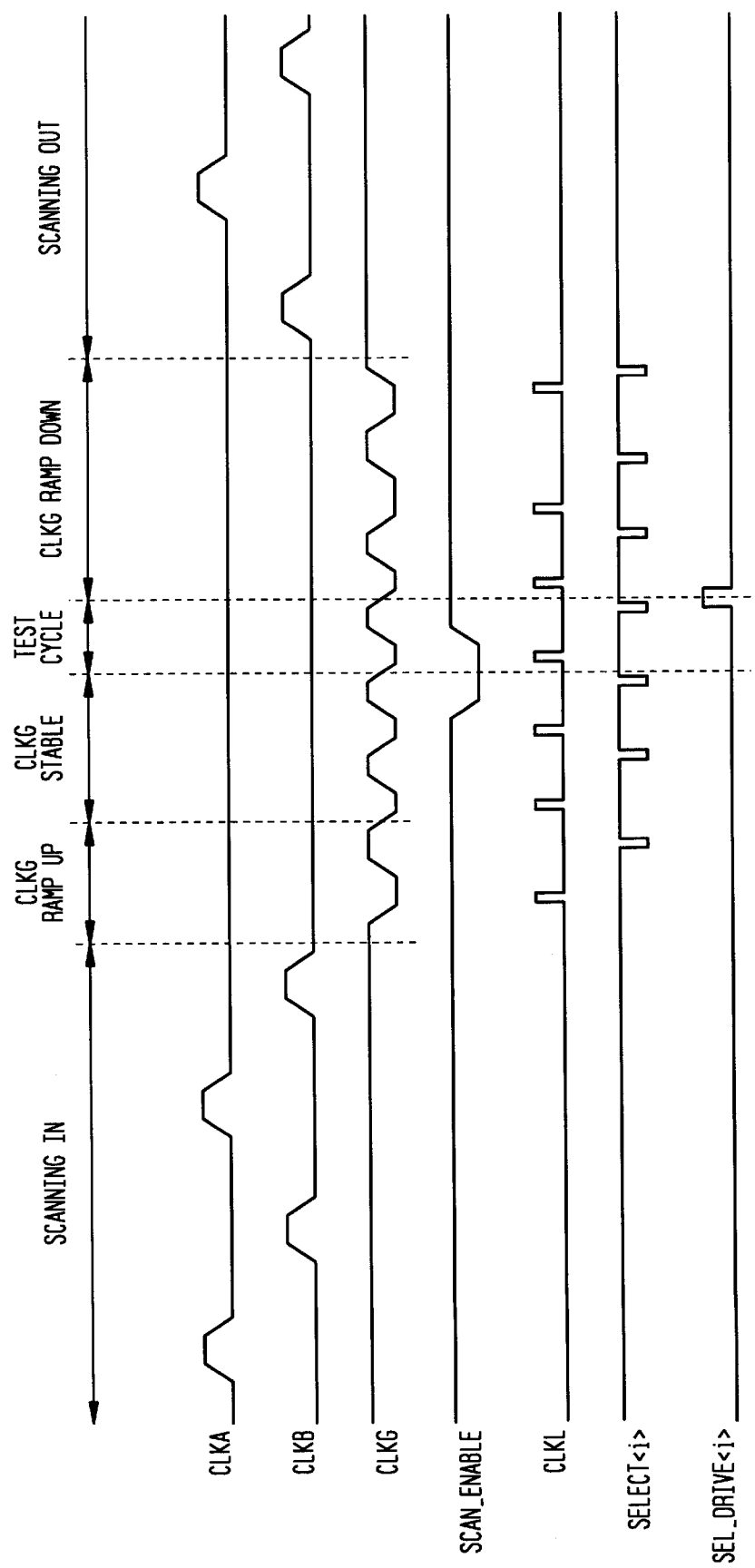

FIG. 10
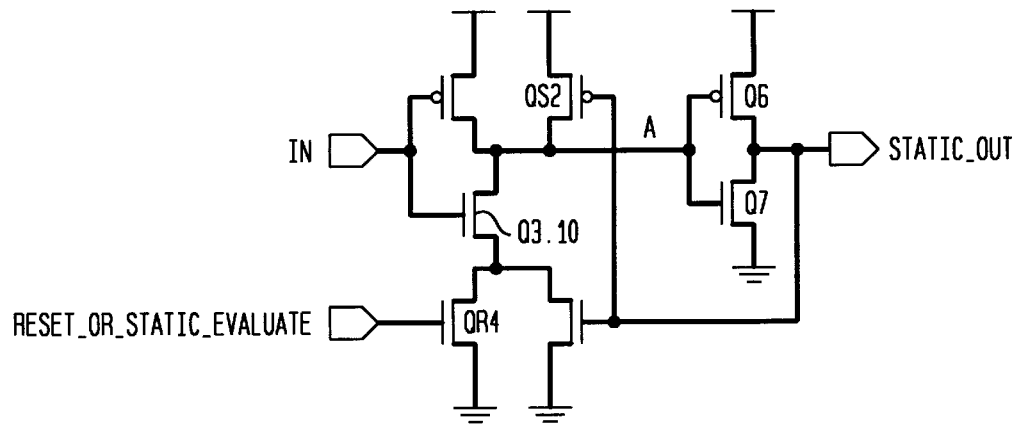
FUNCTIONAL MODE
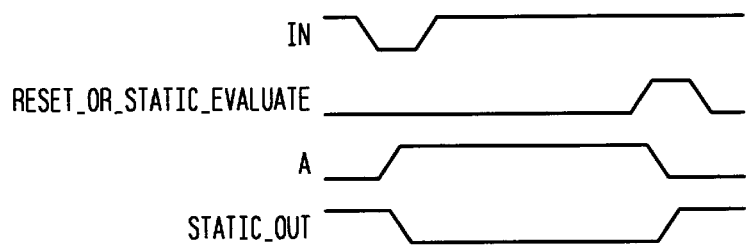
STATIC_EVALUATE TEST MODE
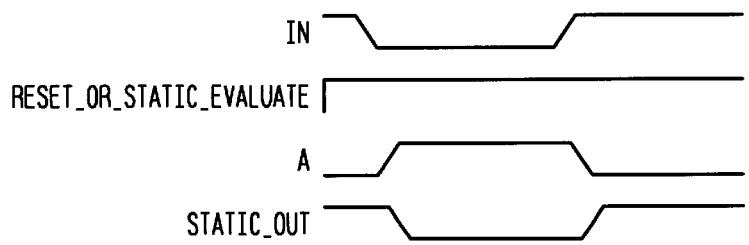

HIGH PERFORMANCE REGISTERS FOR PULSED LOGIC

FIELD OF THE INVENTION

The invention relates to self-resetting CMOS circuits.

BACKGROUND OF THE INVENTION

In pulsed logic, such as Self-Resetting CMOS (SRCMOS) logic as described in copending and commonly assigned U.S. patent application Ser. No. 08/463,146, filed Jun. 5, 1995 incorporated herein by reference (hereinafter ("Chappell"), data (logical 0's or 1's) are represented by pulses, or the absence of pulses, on a given net, rather than as voltage levels as in other logic families. To implement sequential logic, these pulses must be launched from and captured into registers.

Since, in practice, however, chips using SRCMOS will also have static and possibly domino-type logic, a modular register approach that can be adapted to all of these logic types poses advantages. Such a register must, however, comply with and implement the circuit-level test modes described in commonly owned and copending U.S. patent application Ser. No. 08/583,300, entitled "Methodology to test pulsed logic circuits in pseudo-static mode", by M. P. Beakes et al., filed concurrently herewith, and incorporated herein by reference.

In particular, SRCMOS logic can be tested by a test mode called the "static evaluate mode". In this mode, resets are inhibited, by a global signal, "Evaluate", being active. At the same time, a recovery mechanism is activated to recover from false switching events (noise, glitches) such as might occur in mistimed chips. This recovery mechanism uses small leakage pFETs, switched on by another global signal, called "Static_Evaluate". These leakage pFETs weakly pull up unidirectional switching nodes, effectively converting such unidirectional circuits to pseudo-nMOS circuits. See N. H. E. Weste and K. Eshraghian, Principles of CMOS VLSI Design, A Systems Perspective, Addison Wesley, Reading Mass., 1988.

A further requirement of the register is that it comply with the Level Sensitive Scan Design methodology. In the LSSD testing methodology, a single-cycle AC performance test is defined. In this test, data is scanned into the registers, a single functional cycle is executed, and the resulting data is scanned out of the registers. Since pulsed logic is used in very high speed chips, single-cycle AC performance testing requires that the Scan_Enable signal (the global signal that indicates whether the chip is in scan mode or in the (single cycle) functional mode) is synchronized to the system clock, without incurring the cost of a high speed precision distribution network.

Whenever preservation of register state over many machine cycles is required, a static register based on transmission gate inputs is advantageous. Such a register will hold state when none of its input ports is selected, without dissipating power associated with the input port multiplexer. Power dissipation in the holding state should be minimal.

However, transmission gate register structures are sensitive to false switching events on their Select lines, which may cause false data to be written. This can happen in a mis-timed chip in cycles where these false data are not subsequently overwritten by correct data. That is, in "hold" cycles where none of the input gates was supposed to be activated. The pseudo-nMOS type recovery mechanism of unidirectional switching nodes in static evaluate test mode, is not applicable to transmission gate type registers.

SUMMARY OF THE INVENTION

The present invention describes a high performance register and control circuitry that can be used as a pipeline register in logic chips that are designed using a pulsed logic methodology. It features minimal set-up time, pulse catching and pulse launching.

Accordingly, the present invention provides a high performance register and associated control circuitry that implements the foregoing test modes, and which is LSSD compliant, including support for a single cycle AC performance test.

An alternative register and control circuit, with power reduction features, is also described.

The register circuitry described herein complies with and implements a circuit-level test methodology for pulsed logic that features the ability to inhibit the reset of pulses, to force resets, and to operate the circuits in a pseudo-static mode. Furthermore, the register complies with Level Sensitive Scan Design (LSSD).

It is a further object of the invention to provide a register with a self-resetting input multiplexer, and therefore requiring minimal setup time.

It is a further object of the invention to provide such registers with output stages that launch pulses according to the self-resetting methodology.

It is a further object of the invention to provide such registers with pulse-catching data inputs.

It is an object of the invention to provide a register employing a plurality of modules for interfacing surrounding logic, so that the register can be used with any combination of static, pulsed, or domino logic.

It is a further object to provide circuitry to make the above described register compliant with the Level Sensitive Scan Design (LSSD) methodology for testing of complex logic circuitry.

It is a further object of the invention to provide a scheme and the circuitry that allow static transmission gate input registers to comply with the static evaluate test mode.

It is an object of the invention to provide another register having a conventional static master-slave core, with a transmission gate type input multiplexer, to hold state without undue power dissipation.

It is a further object to provide a method to reduce the switching activity in the register when it is holding state, thereby further reducing power dissipation.

It is a further object of the invention to provide a scheme and circuitry that allow transmission gate input registers to be immune to false switching events on primary select inputs in static evaluate mode, and also in other ways to strictly comply with this test mode.

BRIEF DESCRIPTION OF THE DRAWINGS

FIG. 3 is a detailed schematic depiction of the register bit cell of FIG. 1.

FIG. 3a is a detailed schematic representation of four-input inverter I1 of FIG. 3.

FIG. 7*a* and FIG. 7*b* are waveforms representing the operation of the register control circuit of FIG. 6.

FIG. 8 is a waveform representation of the scanning and single cycle AC performance test operation of the circuit of FIG. 6.

FIG. 10 is a schematic depiction, with associated waveforms, of a pulse catcher suitable for use in the system of FIG. 1.

DETAILED DESCRIPTION OF THE PREFERRED EMBODIMENTS

Copending and commonly owned U.S. application Ser. No. 08/583,300 describes the test modes and test signals that have been defined to perform circuit-level testing of pulsed logic. In accordance with these test modes, global signals have been defined to force dynamic circuits to their reset states or to inhibit resets, thereby keeping circuits in their evaluated states; and in order to isolate timing faults, a so called "Static_Evaluate mode" has been defined, in which all circuits behave as if they are static, instead of pulsed. The circuit features needed in registers to comply with these modes are described in detail below.

The present invention further includes a high performance register and control circuitry that can be used as a pipeline register in logic chips that are designed using a pulsed logic methodology. The register features minimal set-up time, pulse catching and pulse launching. An alternative register, with power reduction features, is also described.

Register bit cell

Figure 1:
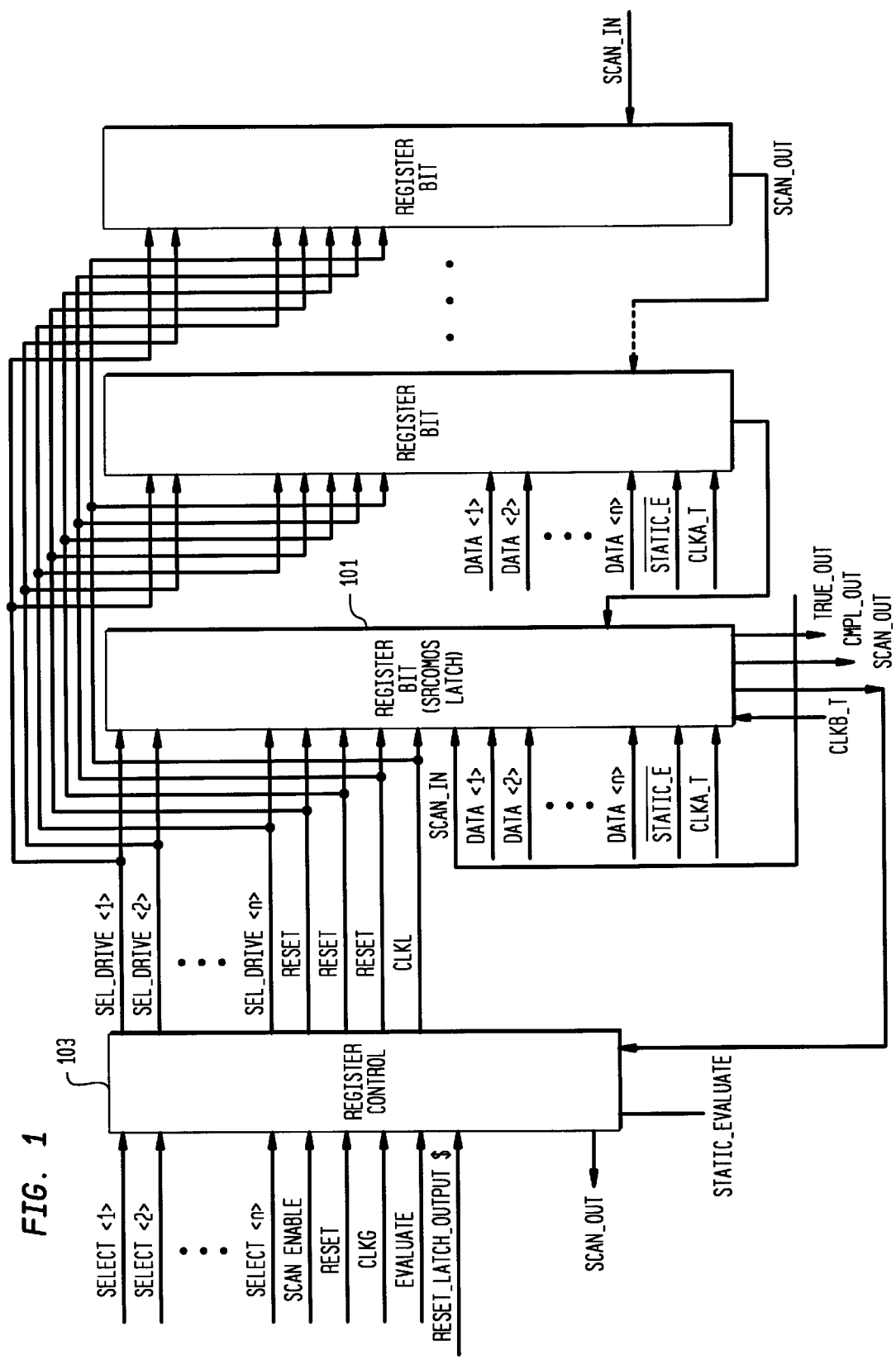
FIG. 1 is a block diagram of a system in accordance with the invention.
Figure 2:
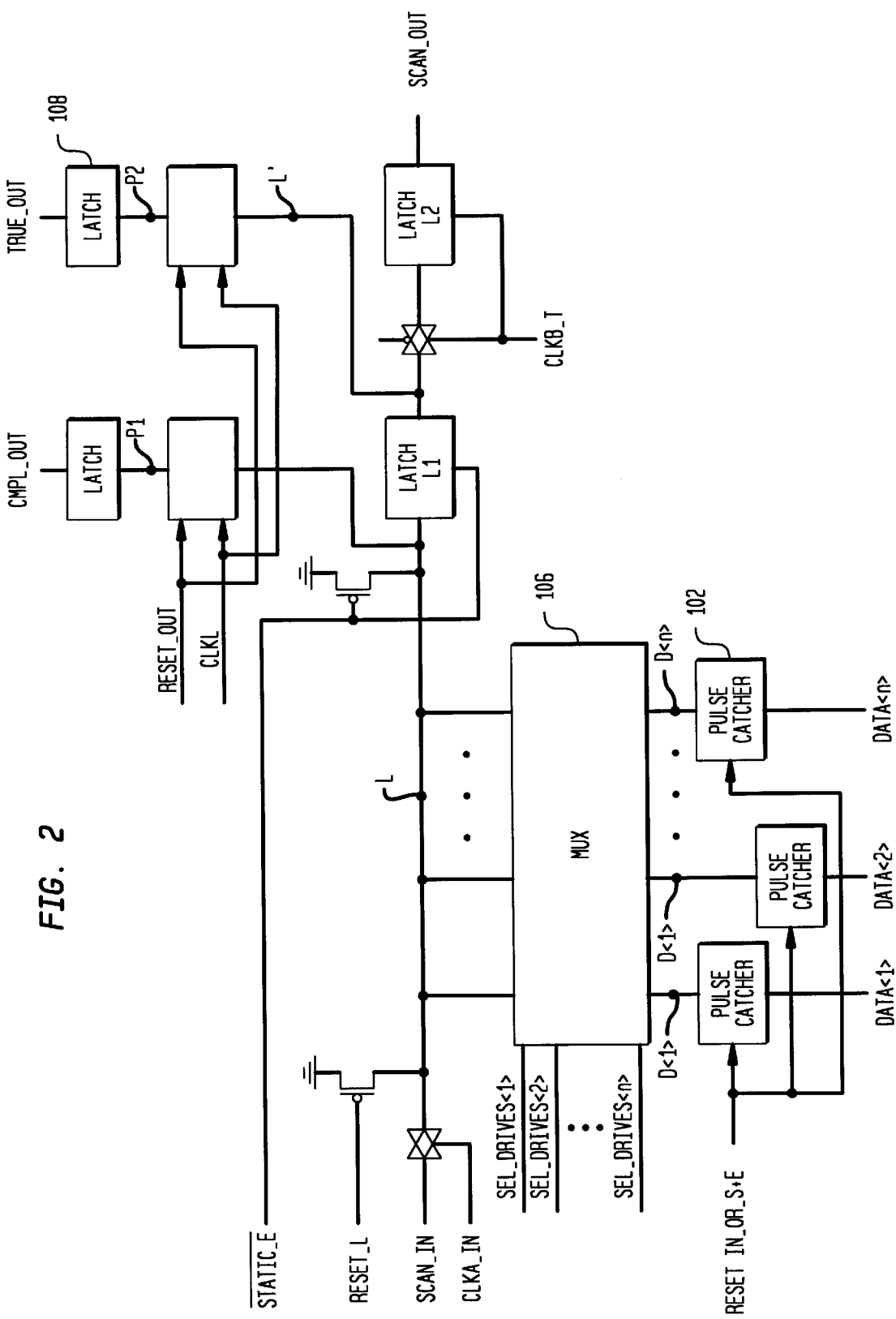
FIG. 2 is a more detailed depiction of a register bit cell shown in FIG. 1.
Figure 4A:
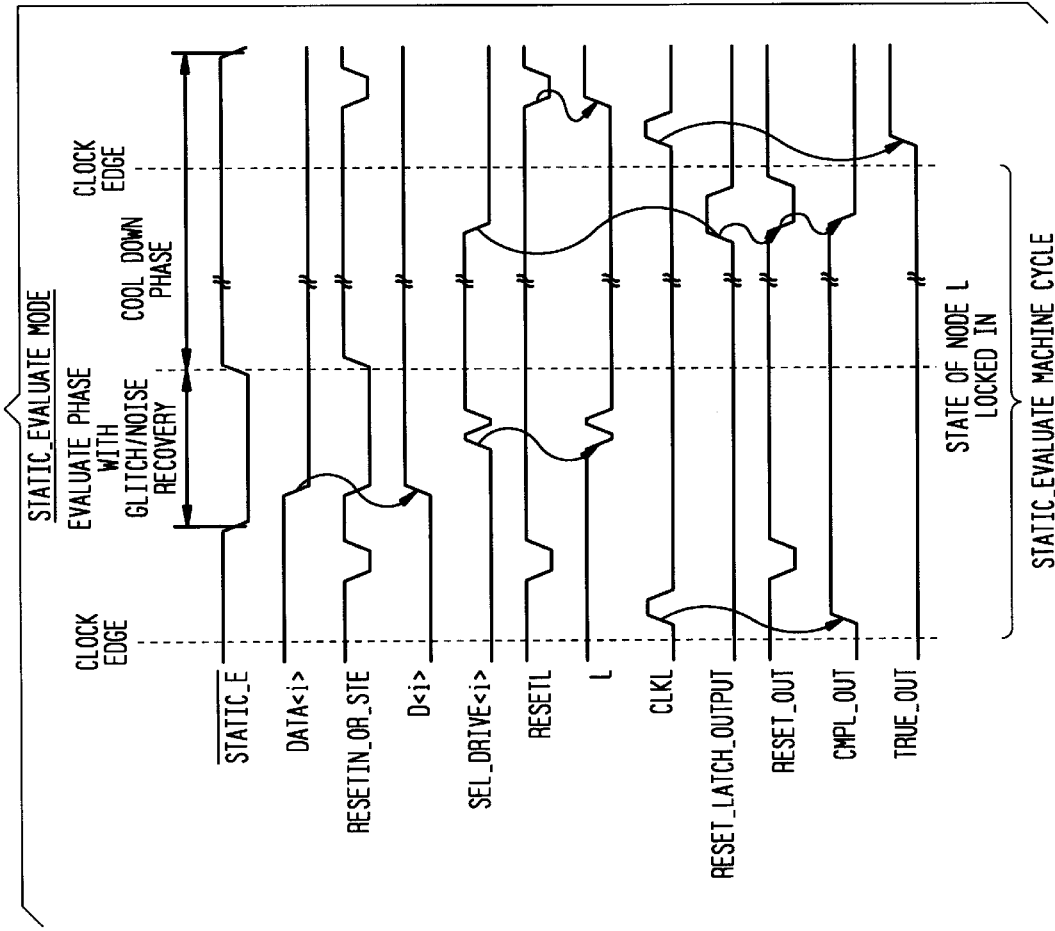
FIGS. 4a and 4b are waveform representations of the operation of the register bit cell presented by FIG. 3.
Figure 5:
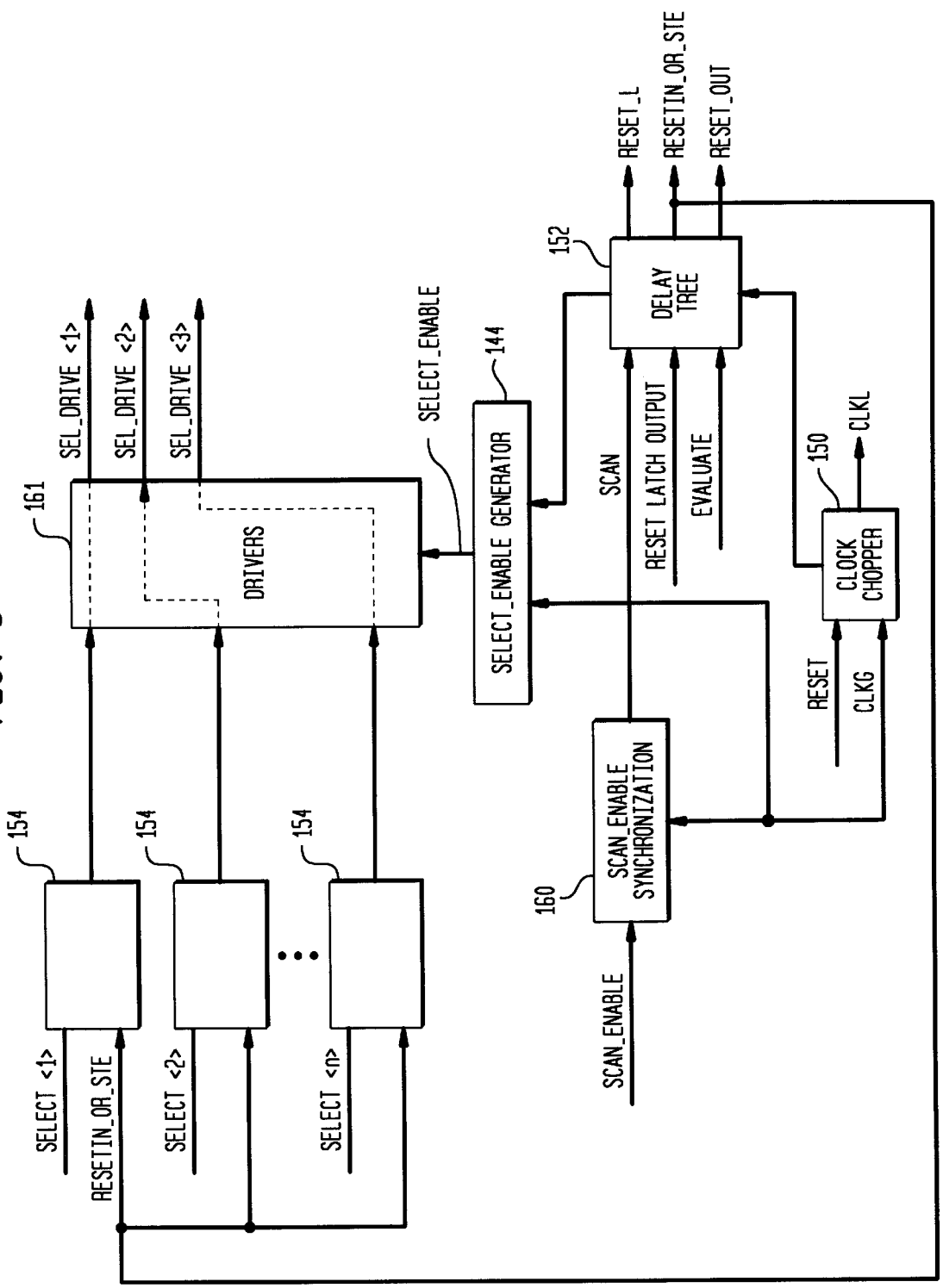
FIG. 5 is a more detailed block diagram representation of the register control circuit of FIG. 1.
Figure 6:
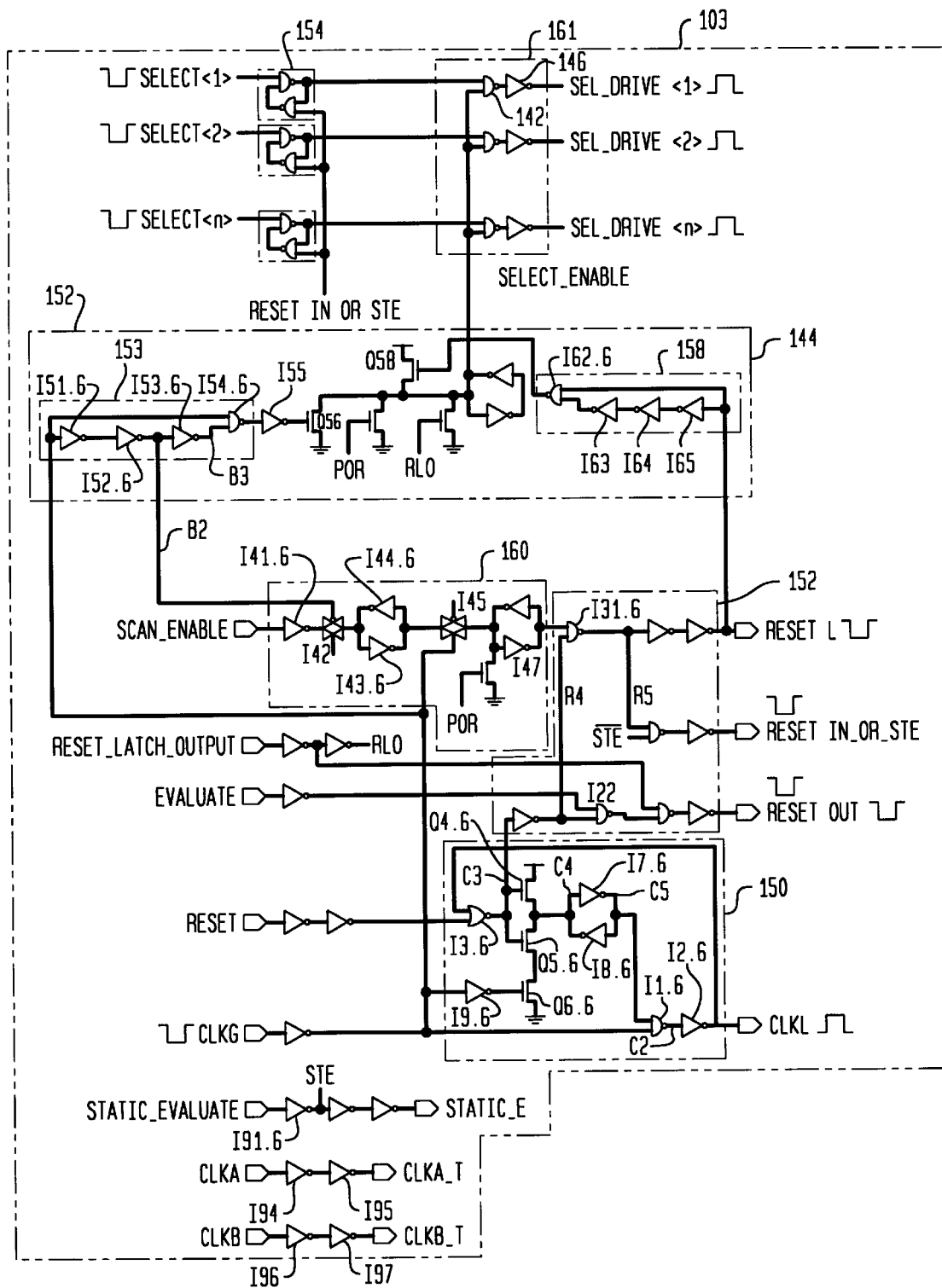
FIG. 6 is a detailed schematic depiction of the register control circuit of FIG. 5.

FIG. 1 shows a block diagram of a CMOS register, which comprises a register control block and one or more bit cells, that complies with LSSD and the functional, static_ evaluate, and reset modes of operation. The latter two operational modes are described in detail in U.S. patent application Ser. No. 08/583,300. FIG. 2 is a block diagram of the bit cell 101. FIG. 3 shows the detailed schematic of the bit cell 101. Waveforms are shown in FIG. 4, and the register control section generating these signals is shown in FIGS. 5 and 6.

Referring to FIG. 3, the SCRMOS Latch 101 receives data inputs via pulse catchers 102 coupled to inputs Data <1>. Data <n>. The particular data input to be latched into the latch is selected by means of select lines Select_drive <1> . . . Select_drive <n>. Control inputs Reset_out, CLKL, $\overline{\text{Static\_eval}}$,Reset L and scan_in are also provided. The functional details of these control inputs are discussed below. LSSD capability is provided by scan output scan_in, transmission gates I30, I31, clocked by the non-overlapping scan clocks, CLKA_T and CLKB_T, respectively, the L2 latch 104 and the scan output scan_out.

The latch produces true and complementary output pulses at True-out and CMPL-out, respectively.

Although the register bit cell as shown is configured for multiple pulsed data input ports (Data<1> . . . Data <n>) and a dual rail pulsed data output port (CmpL-out and true_out), which launches output data pulses every cycle, other configurations, such as single rail pulsed output ports, read-on-demand output ports and static output ports can be configured easily. See below.

Normal functional operation

The normal functional operation of the latch of FIG. 1 is now described with reference to FIG. 3 and the corresponding timing diagram of FIG. 4*a*. In FIG. 3, the polarity of various pulsed nets (active low or active high) is schematically indicated for normal functional operation.

Incoming data pulses Data<i> (i=1 . . . n) are captured in pulse catcher circuits 102. These pulse catcher circuits can be cross-coupled NANDs I102, as shown in FIG. 2, which capture active-low incoming pulses. Cross coupled NOR pulse catchers can be employed for active-high incoming pulses. Thus, whenever a pulse, signifying a logical 1, arrives on a Data<i> input, the corresponding node D<i>(i=1 . . . n) goes high. A pulldown conductance is established when the corresponding Select_drive<i> also goes high, and latch node L is pulled down by the active pair of transistors Q11, Q12, or Q21, Q22.3, or, . . . , Q91, Q92. The transistors Q11, . . . ,Q92 form the nFET tree of an input multiplexer 106, and will collectively be referred to as such.

A pair of back-to-back inverters I0 and I1 form a latch L1 whose purpose is to maintain the state of node L, even when the pull down legs of the input multiplexer are deactivated. The feedback inverter I1 (comprising a pFET and nFet arranged to form an inverter) is sized such that its pFET can be easily overwhelmed by the series nFETs of the multiplexer pull down legs (Q11 . . . Q92), while still providing adequate protection against false switching due to noise on the Select_drive<i> lines. The nFET path of I1 has small enough conductance to be easily overwhelmed by the reset transistor, QR3.

At the beginning of the next cycle (cycle 2 in FIG. 4*a*), an active high pulse is fired on the CLKL (local clock) net. Depending on which side of latch LI is high, this will pull down either node P1 or P2, which makes the corresponding output, Cmpl_out or True_out (sensed at output latches 108) go high. For example, if node L is high and node L' is Low, CLKL will cause transistors Q42 and Q52 to turn on, producing a low at node P1 while P2 stays high (standby). This will cause a rising edge at cmpl_out, while true_out stays low (standby). After CLKL has gone low again, an active low Reset_out pulse is fired, which pulls (in this example) node P1 up again through transistor QR41. This generates a falling edge on Cmpl_out, resetting it to its stand-by state. It will be clear to those skilled in the art how the circuit operates in the event that L' is high. Notice that on this dual-rail output, a pulse on True_out corresponds to a logical 1, and a pulse on Cmpl_out to a logical 0.

Once CLKL has gone low, the latch node L must be reset to stand-by high, to prepare for the next input data. This is accomplished by an active low pulse on net ResetL, which pulls up node L through transistor QR3.

The net effect of this is that node L is reset early in the cycle, every cycle, to its high state, so as to store a logical 0 in latch L1, (i.e., the output node L' of latch L' is low). Later in the same cycle, node L may be pulled down to its low state by the input multiplexer 106, to store a logical 1. The stored value is then kept until after the data is launched out by CLKL in the next machine cycle, after which it is reset again.

Finally, the data input pulse catchers 102 must be reset in order to accept new input data pulses. This is accomplished by an active low pulse on net ResetIn_or_StE, which will result in the nodes D<i> being reset to standby low.

Static_Evaluate mode

The Static_Evaluate mode of operation of the latch of FIG. 1 will now be described with reference to FIGS. 3 and 4b.

In Static_Evaluate mode, the requirements on the signals described above, change. The requirement in static-evaluate mode is to maintain the outputs Cmpl_out and True_out static. To keep the output data static, the reset of the output pulse launcher (applied as Reset_out to Q41 and Q51) must be inhibited, and the input data at lines Data<1> . . . Data<n>(now static) must be captured only after all noise and glitches on the inputs have settled.

This mode is now described in detail. In Static_Evaluate mode, the Data<i> inputs become static, and the pulse-catchers 102 must become transparent, so that nodes D<i> follow the inputs Data <i> and can recover from false Data <i> transitions that result from noise or glitches. This is accomplished by pulling ResetIn_or_StE (the inputs to NANDS I102,) low in this mode. (See FIG. 6 for Reset IN_or_STE).

Latch node L must follow the transitions on D<i> and Select_drive <i>, and must also recover from false transitions resulting from noise or glitches at the Data<i> inputs. That is, node L must have the ability to pull up high again if the combination of the Data <i> and Select_drive<i> signals does not result in a pulldown, even if there was a false pulldown earlier in this phase. For example, in FIG. 4b a false transition on Select_drive<i> is indicated during the period denoted "Evaluate phase with glitch/noise recovery" (hereinafter referred to as the "evaluate phase"), from which node L recovers (i.e., returns to a high state immediately. following the false transition), before the evaluation to the final state at the point labelled "state of node L locked in".

This is accomplished by disabling ResetL (i.e., preventing the occurrence of Reset pulses) and enabling the small leakage transistor QD2 by pulling node $\overline{Static\_E}$ low during the evaluate phase of the static_evaluate mode. As mentioned before, $\overline{Static E}$, is an inverted form of the global signal Static_Evaluate, which has an asymmetric duty cycle to mitigate self-heating by static power dissipation.

FIG. 3A shows a transistor level representation of inverter I1. I32 is identical except that it has no $\overline{Static\_Evaluate}$ input and associated transistor.

The pulldown path of feedback inverter I1 is disabled when $\overline{Static\_E}$ is low, so that QD2 does not have to struggle against the I1 nFET path. QD2 is sized such that it can be easily overwhelmed by the input multiplexer.

At the end of the evaluate phase of the static_evaluate mode, global signal Static_Evaluate goes low (thus $\overline{Static\_Evaluate}$ goes high), disabling QD2 and enabling feedback inverter I1, so that the state of node L is locked in at that point in time. This effectively constitutes the capturing of the input data (given by Data<i> and Select_drive<i>, both of which are now static signals) into the L1 latch. The evaluate phase is chosen to be sufficiently long to enable all noise and glitches to die out, and to allow all circuits on the chip to evaluate to their final state. At the end of the evaluate phase, all nodes are statically held in this final state.

Whereas the latching-in of data at the end of the evaluate phase occurs naturally by switching off QD2 and enabling I1 in this register bit design, this function requires more attention in a conventional register bit design based on a transmission-gate input multiplexer. This is described in detail below.

In Static_Evaluate mode, the normally pulsed output data must be held static. Hence, Reset_out is disabled (held high), so that the outputs do not reset during the evaluation phase of the machine cycle. Since CLKL is still a pulse of short duration, nodes P1 and P2 would effectively float (i.e., be coupled neither to ground nor to a voltage supply) once the CLKL pulse has turned off. This floating state would persist for a long period of time in the slowed down system cycle in this mode. Thus, small feedback inverters I45.3 and I55.3 of the output holding latch are employed to maintain the states of nodes P1 and P2. These feedback inverters are sized to be easily overwhelmed by the reset transistors QR41 and QR51, or by the respective pulldown paths via Q42, Q43 or Q52, Q53.

At the end of the Static_Evaluate machine cycle, once all the data are captured, the pulsed data outputs must be reset to prepare for the next data launch. This is accomplished by applying a pulse to the Reset_out line of the latch, the pulse being triggered by the global signal, called Reset_Latch_Output in the present invention. Reset_Latch_Output is a global signal which has a pulse every machine cycle (toward the end of the cycle) in the static_evaluate mode (See FIG. 4b).

Figure 4B:
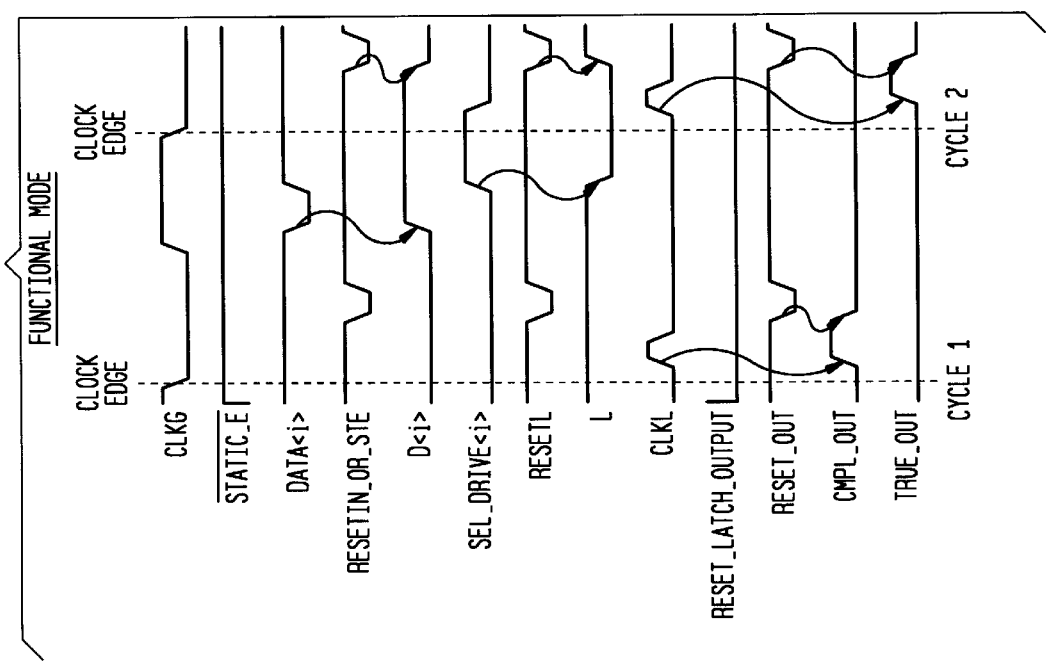

As indicated in FIG. 4b, there is a gap between the trailing edge of Static_Evaluate (or $\overline{Static\_E}$) and the occurrence of the Reset_Latch_Output pulse. This gap may be short, as in static_evaluate debug mode under functional conditions, or long, as under burn-in conditions, to stress down-stream logic devices in their evaluated state, and to allow cooldown from the self-heating that occurred in the evaluate phase.

Scan mode and single-cycle AC performance tests

To comply with LSSD scanning and single-cycle AC performance tests, several requirements are satisfied by the latch of FIG. 1.

First, a plurality of register bit cells 101 (latches) of FIG. 1 can be configured in a scan chain, with the Scan_out node of one bit connected to the Scan_in node of the next bit.

Second, because during scanning the contents of the bit cell of FIG. 1 should not be erased, both ResetL and the multiplexer select lines, Select_drive<i>, are disabled.

Third, if the global chip clock, CLKG, is left free running during scanning, it would be possible to fire local clock signal CLKL, which is derived from CLKG, coincidentally with the rising edge of the scan clock CLKA_T. (CLKA_T is the locally buffered version of global scan clock CLKA, see FIG. 6). In that case, the register bit could change value during the firing of CLKL, which could lead to conflicting pulses being launched into down stream logic. (E.g., both True_out and Cmpl_out pulses, or no pulse on either output.) Hence, either CLKL and CLKA_T should be synchronized to ensure non-overlap; or, CLKL must be disabled during scanning. In the present embodiment, the latter option was chosen.

Performance

Note that in FIG. 3a feedback inverter I1 is disabled during CLKA (CLKA_T) and feedback inverter I32 is disabled during CLKB (CLKB_T). CLKB_T is the locally buffered version of the global scan clock CLKB, FIG. 6. This allows the scan transmission gates I30 and I31.6, as well as the circuits driving them (inverter I0, e.g.), to be quite small, thereby minimizing the capacitive load on node L and enhancing performance, while abiding by LSSD scannability requirements.

Note also that since the latch of the present invention utilizes an nFET-only ($Q_{11}$, $Q_{12}/Q_{21}$, $Q_{22,3}/\ldots/Q_{s1},Q_{s2}$) pull-down when writing into the register bit cell (as opposed to both pull-up and pull-down through, e.g., a transmission gate input multiplexer), the set-up time for data inputs when compared with CLKL (and therefore system clock CLKG) is minimal.

The cost of the above accommodations is that a reset signal must be applied every cycle. Thus, this register does not hold state unless a wrap-around is defined from a data output port to one of the data input ports, together with extra overhead in control logic. This register is suitable, therefore, for use as a pipeline register, capturing and launching data pulses every cycle. A lower performance static register that holds state, while being compatible with all the functional and test modes described herein, is described below.

Similarly, output pulse launch time is minimal, as, according to the SRCMOS logic philosophy, the logic (i.e., ANDing of latch nodes L and L' with CLKL) is done in nFETS, while lower performance pFETs are used only in inverters and for reset.

Register control circuitry

A register control circuit that generates all the signals (specifically, the signals ResetL, ResetIn_or_Ste, Reset out, CLKL and Select_Drive<i>) in compliance with the requirements described above is shown in FIG. 6 (with a corresponding block diagram in FIG. 5). The circuit elements representing the various functional blocks of FIG. 5 are outlined in dotted lines labelled with the corresponding reference numerals in FIG. 6. In FIG. 6, the polarity of various pulsed nets (active low or active high) is schematically indicated for normal functional operation. Waveforms are given in FIG. 7.

The register control circuit of FIG. 6 includes a pulse catcher 154 associated with each select line select<i>, i=1 . . . n. The Select<i> (i=1 . . . n ) inputs are configured in FIG. 6 to accept active low incoming pulses. The function of a pulse catcher is to convert an incoming pulse from eternal control logic to a static level. When a pulse comes in on a given Select<i> input, the corresponding node S<i> goes high. Similar arrangements, through cross-coupled NORs, could be made for active high incoming pulses. Static control inputs could even be fed directly into nodes S<i>.

The outputs S<i>of the pulse catchers 154 are connected as inputs to respective NAND gates 142 of a driver circuit 161, the other inputs of the NAND gates coming from a select-enable generator 144. The outputs of NAND gates 142 are inverted by inverters 146 and applied as select-drive<i> signals to latches as shown in FIG. 3. Also included in the register control circuit are a scan-enable synchronization circuit 160 which locally synchronizes the scan_enable signal to the system clock (CLKG), a clock chopper 150 which generates a truncated, inverted version of the global clock signal CLKG, and a delay tree 152 which provides the various other signals (Reset_out, Reset_in_ or_StE, ResetL) with appropriate timing and interlocks. The details of the circuit of FIG. 6, will now be discussed.

Gates I1.6 through I3.6 and I7.6 through I9.6, with transistors Q4.6, Q5.6 and Q6.6, implement the clock chopper 150, which generates an active high local clock pulse, CLKL, following a falling edge on the system clock node, CLKG. The circuit resets itself through the feedback loop formed by NOR gate I3.6, transistors Q4.6 inverter I7. Once having reset, the reset state of the clock chopper 150 (node C2 driven high by node C5 being driven low) persists until the next rising edge of CLKG, which activates Q6.6 (via inverters I0 and I9), so that node C4 is driven low and C5 high. This "re-arms" the clock circuitry so that it can fire again at the next falling edge of CLKG.

The CLKL pulse causes the leading edge of the output signal CMPL_out or True_out in the bit cells of FIG. 3. Subsequently, the CLKL pulse is the starting point for all the other functions of the register control block as explained below.

Normal functional operation of Register Control Circuitry

In normal functional operation, the CLKL pulse travels along the path formed by nodes C3, R4, R5, ResetL, while along the way spawning off the (active low) reset pulses Reset_out and ResetIn_or_StE for use in the latches 101. Then, from the trailing (i.e., rising) edge of ResetL, the one-shot circuit 158 formed by I62.6, I63, I64, I65 is fired, which, through Q58, pulls node Select_Enable high.

If one of the S<i> nodes has gone high, and Select_Enable has gone high, the corresponding Select_drive<i> goes high and activates a leg of the input multiplexers 106 of the latches 101 of FIG. 3.

At the beginning of the next cycle, the falling edge of system clock CLKG activates the one-shot circuit 152, which comprises I51.6, I52.6, I53.6, and I54.6, and through I55 and Q56 pulls down node Select_Enable, and thereby the Select_drive<i>. Cycle time stretching is thus automatically accommodated. The Select<i> pulse catchers 154 are reset by the same ResetIn_or_StE signal that resets the pulse catchers 102 in the bit cells 101, and the activated node S<i> returns to its inactive low state. This completes the normal operation cycle. The waveforms for normal functional mode are shown in FIG. 7a.

Notice that the pulling down of Select_Enable (and thereby of Sel_drive<i>) will occur at or shortly after the CLKL pulse, so that the register bit cells 101 are transparent for a very short period of time. With so-called "short paths", this may be a timing hazard.

In FIG. 6, no provision has been shown for ensuring the orthogonality of the signals on Sel_drive<i> (at most one should be active per machine cycle). Orthogonality or priority circuitry could be integrated either in the register control circuitry or in external control logic.

Static_Evaluate mode of Register Control Circuitry

In Static_Evaluate mode, the waveforms for which are shown in FIG. 7b, CLKL fires short pulses, as usual. The global signal Evaluate is asserted high, so that the normal firing of Reset_out is inhibited from switching through NAND gate I22. Thus the True_out or Cmpl_out bit cell 101 outputs, asserted by CLKL (FIG. 2), hold their state, until at the very end of the Static_Evaluate machine cycle an (active high) pulse on global signal Reset_Latch_Output causes a low pulse on Reset_out. This resets the True_out and Cmpl_out bit cell outputs (FIG. 2). Reset_Latch_Output also pulls down Select_Enable. This effectively ensures non-overlap between the Sel_drive <i> and CLKL, so that in this mode the bit cell 101 latches are never transparent. This eliminates the short path timing hazard described above, and thereby provides a method of diagnosing these hazards if they occurred in the functional operation of the chip.

The signal $\overline{StE}$ (at the output of inverter I91.6) derived from the global signal Static_Evaluate, is routed into NAND gate I34, so that whenever Static_Evaluate is active (i.e., during the evaluate phase), ResetIn_or_StE is caused to be low, thereby effectively reducing the cross-coupled NAND pulse catchers 154 and 108 for the Select<i> signals and Data<i> signals, respectively to inverters.

Power-on-Reset and leakage tests

Power-on-Reset is accomplished by placing an active high pulse on global signal Reset. This is NOR-ed with CLKL at NOR gate I3, and causes all the Reset outputs (specifically, Reset_out, ResetIn_or_StE and ResetL) of the register control circuitry of FIG. 6 to go to their active states, thereby activating all the reset devices in the bit cells 101 as well as in the CLKL generator (clock chopper 156).

In leakage test mode, Reset can be held so that device leakage can be measured while all reset devices are actively held ON. In another leakage test, the global signal Evaluate is activated after scanning in test data. This prevents the firing of Reset_out by inhibiting NAND gate I22 in FIG. 6. Thus, the True_out or Cmpl_out bit cell 101 outputs of FIG. 2, asserted by CLKL, as well as subsequent down stream logic (as in FIG. 1), hold their state, and leakage can be measured in this evaluated state.

If the global signal Evaluate were to be switched off after such a test, all evaluated circuits as in FIG. 1 would simultaneously reset, chip wide. This may cause an unacceptable power surge. Instead, graceful recovery from this Evaluate state is accomplished by activating Static_Evaluate and Reset_Latch_Output simultaneously, which allows a slow reset signal to propagate throughout the chip, before Evaluate is switched off.

Scan mode and single-cycle AC performance tests

In compliance with LSSD methodology, the register bits 101 are chained into a shift register latch (SRL) configuration, the so-called scan chain. The chip is in scan mode when global signal Scan_Enable is active. In scan mode, any pattern of 1's and 0's can be scanned into the register. Conversely, any pattern written in through the data inputs can be scanned out. This is accomplished by the action of CLKA and CLKB, which are two non-overlapping global scan clock signals.

The waveforms describing the scan mode of operation are shown in FIG. 8. As described above, during scanning, the contents of the bit cell 101 of FIG. 3 should not be erased. Therefore, in FIG. 3, both ResetL and the multiplexer select lines, Select_drive<i>, must be disabled. This is accomplished by NAND gate I31.6 in FIG. 6. In scan mode, node S5 will be low, so that I31.6 inhibits the CLKL pulse from propagating from node R4 to R5. Thus, it deactivates the ResetL and the "unblanking" one-shot circuit 158, so that Select_Enable (which was "blanked off" by one shot circuit 153 at the beginning of the cycle off of the falling edge of CLKG) is not enabled at the end of the cycle.

For this to work correctly, the S5 input to I31.6 must be low at the beginning of the cycle, at or shortly after the falling edge of CLKG, before the CLKL pulse has propagated onto node R4. This is especially important for the single-cycle AC performance test (the waveforms for which are shown in FIG. 8), where operation mode is switched from scan mode to functional mode during one cycle, and back to scan mode the next. To ensure the necessary synchronization, without incurring the cost of a high precision chip-wide distribution network for Scan_Enable, a local synchronization latch 160 is implemented using inverters I41.6, I43.6, I44.6, I47 and I48, and transmission gates I42 and I45, configured as shown in FIG. 6. The transmission gate I42 is open when CLKG is high and closes at or shortly after the falling edge of CLKG at which point the transmission gate I45 opens. Synchronization latch 160 allows Scan_Enable to be asserted anytime during a cycle preceding the cycle in which Scan_enable is propagated to node S5, constrained only by a small set-up time and hold time with respect to the falling edge of CLKG. Thus, Scan_Enable has almost a full cycle to propagate throughout the chip, relaxing the requirements on its distribution network.

It was mentioned above that if the global chip clock, CLKG, were free-running during scanning, it would be possible to fire CLKL coincidentally with the rising edge of the scan clock CLKA. In that case, the register bit 101 could change value during the firing of CLKL, which could lead to conflicting pulses being launched into down stream logic. To eliminate this possibility, it was decided to globally switch off CLKG during scanning, through a ramp-down/ramp-up procedure, rather than to attempt local synchronization between CLKL and CLKA. Hence, in the register control circuitry of FIG. 6, global scan clocks CLKA and CLKB are only buffered up for use in the register bit cells 101, without any further logic (gates I94, I95, I96, I97).

This configuration results in the waveforms of FIG. 8 for a single-cycle AC performance test. This test consists of various phases, which are now described.

First is a frequency scan-in phase in which the two non-overlapping global scan clocks CLKA and CLKB are toggled, while Scan_Enable is asserted, and CLKG is off. During this phase, a test pattern is scanned into the latches.

The scan-in sequence ends with a CLKB pulse to achieve consistency between master L1 and slave L2 latch, and independence between the data in two subsequent L1/L2 latches in the scan chain.

Second is a frequency ramp-up and stabilization phase for CLKG. CLKL pulses are generated in this phase by means of clock chopper 150 (FIG. 6), so the register bits 101 will fire out pulses into the down stream logic. However, because Scan_Enable is asserted, the input Select_Enable to the driver circuit 161 is not activated, so input data will not be captured.

Third, in the cycle preceding the test cycle, scan mode is terminated by dropping the signal Scan_Enable. As a consequence, in the test cycle itself, Select_Enable in FIG. 6 will be activated and data can be written into the latch 101 following the appropriate Select<i> signal. In the test cycle, pulsed data are launched into subsequent combinatorial logic using CLKL, and captured in the downstream registers using the data input ports (D_IN<i>, activated by Select<i>). This test can be performed as a function of the length of the system clock cycle.

Fourth, sometime during the test cycle, Scan_Enable is reasserted, thus disabling any further data capture into the latch in any cycles following the test cycle.

Fifth, CLKG is then ramped down and stopped to avoid interference between CLKL and CLKA.

Sixth, the data captured in the bit cells 101 is scanned out by toggling CLKA and CLKB, starting with CLKB and verified for correctness.

Set-up and hold times and pulse width requirements

Figure 9:
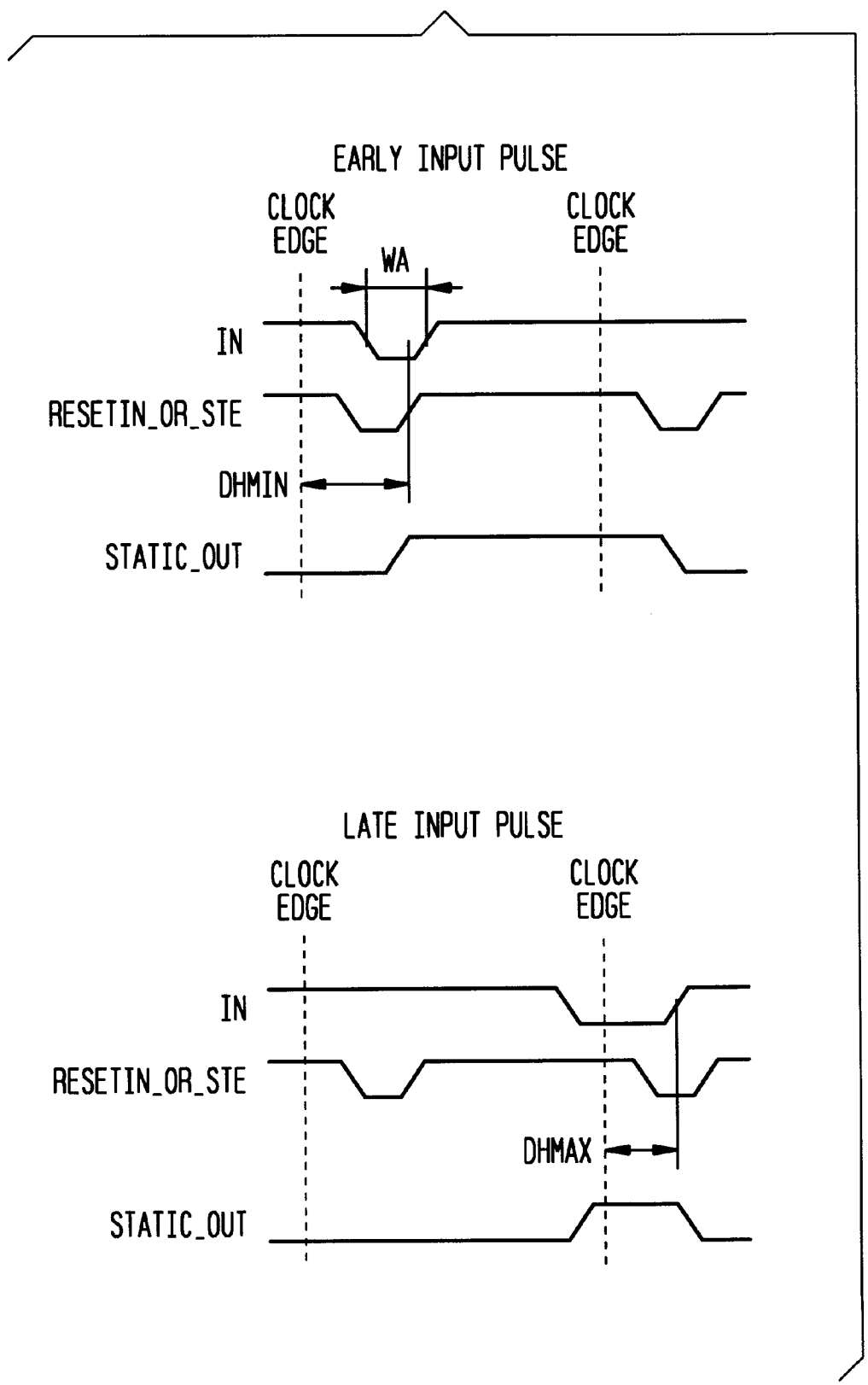
FIG. 9 is a waveform display of restrictions placed upon input pulses used in the present invention.

For the described circuitry to operate properly in normal functional mode, the Select<i> and Data<i> input pulses are subject to several restrictions. The waveforms describing these restrictions are shown in FIG. 9. Notice that the cross-coupled NAND pulse catchers 102 and 154 as used in FIGS. 3 and 6, respectively, are set-dominant, so that in case the input pulse overlaps in time with the reset pulse, the output follows the input pulse.

It is assumed that in normal operation the pulse catchers will be reset every machine cycle, by a reset pulse on the ResetIn_or_StE line, derived from the global system clock, as described above. Thus, the requirements on the input pulses Select<i> and Data<i> (collectively indicated in FIG. 9 as IN) are:

a) A minimum active pulse width, WA, necessary to properly switch the input transistors (not shown) of NANDs I102 and settle the output node D<i> or S<i> (collectively indicated in FIG. 7 as Static_out).

b) A minimum hold time with respect to the CLKG edge, DHmin, for early arriving input pulses. That is, an early arriving signal IN must hold its valid state beyond the end of the DHmin period. This ensures that if an incoming pulse overlaps with a reset pulse, the trailing edge of the input pulse extends beyond the trailing edge of the reset pulse. (The DHmin period corresponds to the trailing edge of ResetIn_or_Ste.)

c) A maximum hold time, DHmax, with respect to the CLKG edge, for late arriving input pulses. This ensures that there is enough time that ResetIn_or_StE is active beyond DHmax to robustly reset the pulse catcher's static output.

The register of FIG. 3, while having a minimal set-up time and launch time, has the disadvantage that data are reset every cycle. Whenever preservation of register state over many machine cycles is required, a static register based on transmission gate inputs is preferable. Such a register holds state when none of its input ports is selected, therefore dissipating minimal power in the holding state.

Such a register is now described. This alternative embodiment of the invention also satisfied LSSD and the static evaluate test modes.

Figure 12:
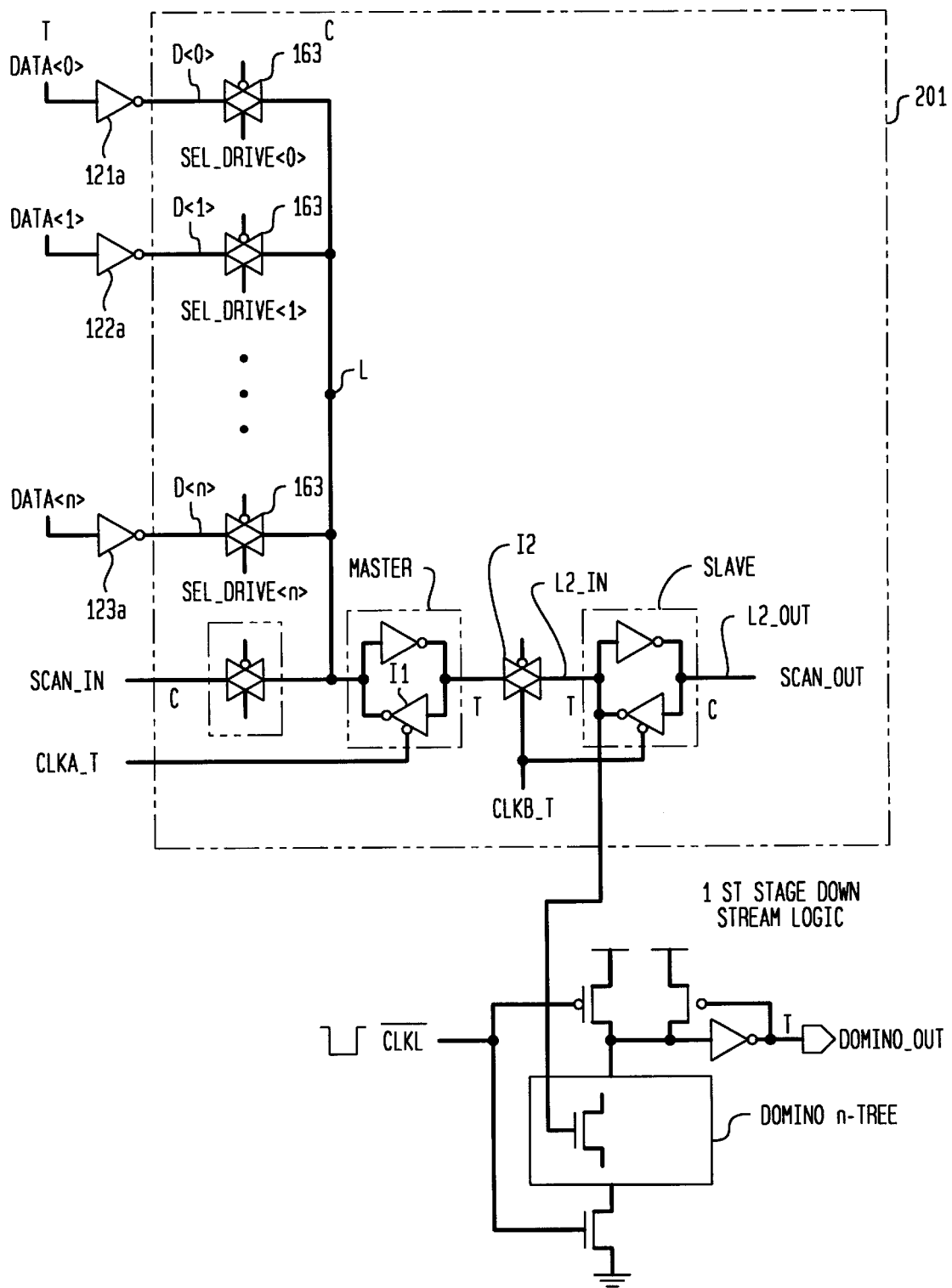
FIG. 12 is a schematic depiction of a register circuit that is interfaced with downstream domino logic.

The wire circuitry of this register is shown in FIG. 12 and comprises master latch L1, slave latch L2, with one or more transmission gate input ports 163, scan-in input port and scan_out output port.

Interface Considerations
Input ports

To interface the bit cell circuit of FIG. 12 with static logic at one of inputs Data<i> is easily implemented. Good design practice would require only one or more inverters 121a–123a of sufficient size at the input ports to be able to drive the substantial capacitance associated with node L and to overwhelm the (minimum size) feedback inverter I1 of latch L1, when the transmission gate 163 for the selected input port opens.

Figure 13:
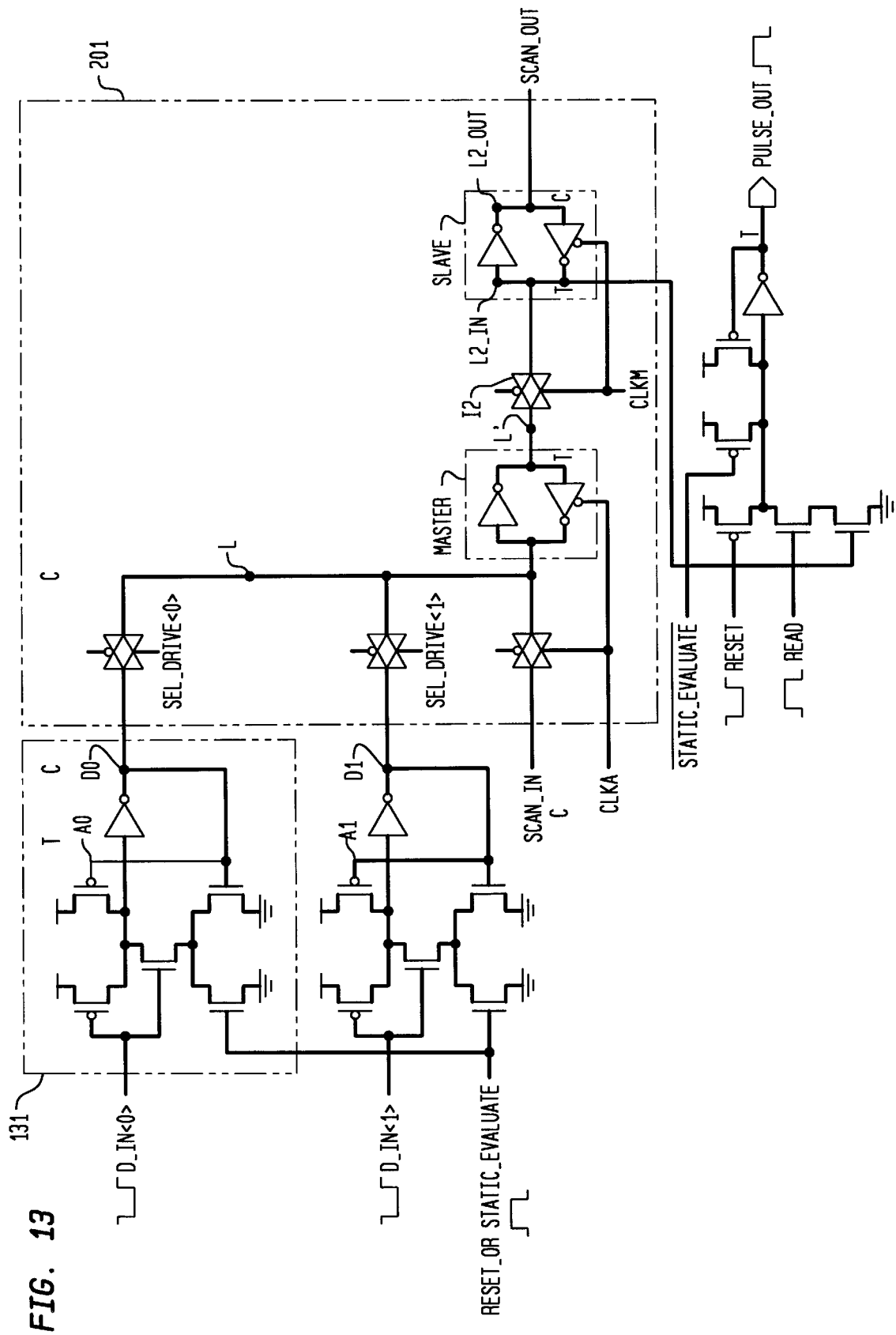
FIG. 13 is a schematic depiction of a register interfaced with downstream pulsed logic.

To interface the input ports D<i> of FIG. 12 with pulsed logic requires the pulse catcher circuit such as 131 in FIG. 13. The pulse catchers 131 must have sufficient drive to switch the substantial capacitance of node L and to overwhelm the feedback inverter I1 through the transmission gates 163.

A pulse catcher suitable for use with a bit cell 201 of FIG. 12 is now described with reference to FIG. 10. The pulse catcher configuration of FIG. 10 is designed for active low input pulses. Associated waveforms are shown as well. The input signals are subject to the same restrictions as described above for cross-coupled NAND pulse catchers: see FIG. 9. As can be seen, a low pulse at input IN will result in a static high at node A as long as the signal Reset_or_Static_Evaluate is held low. When an active high reset pulse occurs on Reset_or_Static_Evaluate, node A will be pulled low. Static_out is the inverted form of node A. This pulse catcher has the following features:

1) It is set-dominant. That is, if an incoming input pulse IN overlaps a reset pulse in time, the output of the circuit will follow the input pulse.

2) Because of the inverter formed by Q6 and Q7, the circuit implements the largest possible drive for the smallest possible area.

3) In the SRCMOS test methodology described in U.S. patent application Ser. No. YO995-054, a Static_Evaluate test mode is defined, in which all resets are inhibited, so that static levels are presented at the input, instead of pulses. In this mode, the pulse catcher must be transparent. That is, its output transitions should follow the input transitions. This feature has been implemented into the pulse catcher of FIG. 10. By combining in the register control section, the reset and static_evaluate signals into a single Reset_or_Static_Evaluate signal, which is applied to the gate of transistor QR4, the desired compliance with the Static_Evaluate test mode is achieved with no extra cost in transistors or register control wires running over the register bitstack.

Figure 11A:
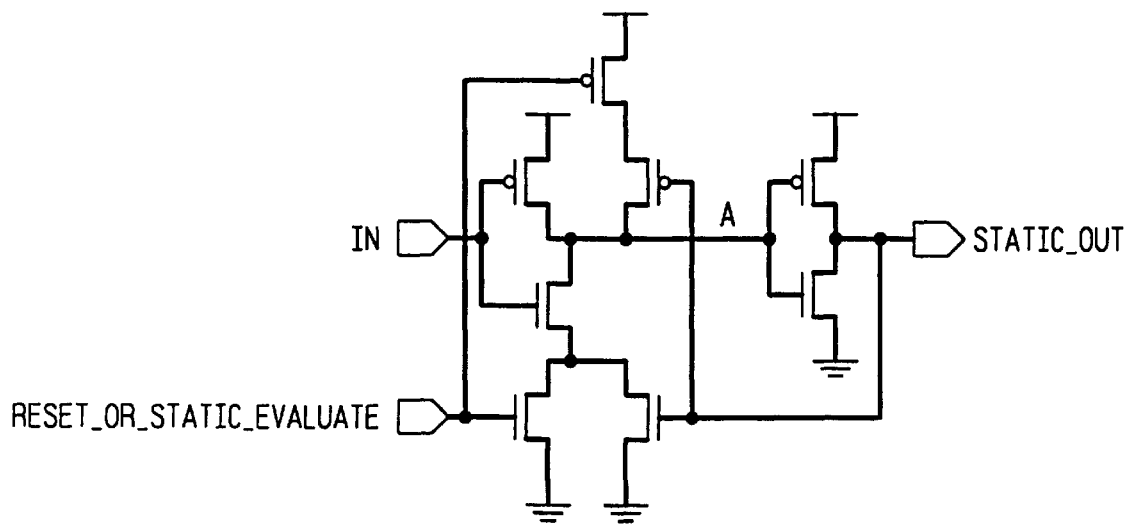
FIG. 11*a* is an alternative embodiment of a pulse catcher for use with the circuit of FIG. 1.
Figure 11B:
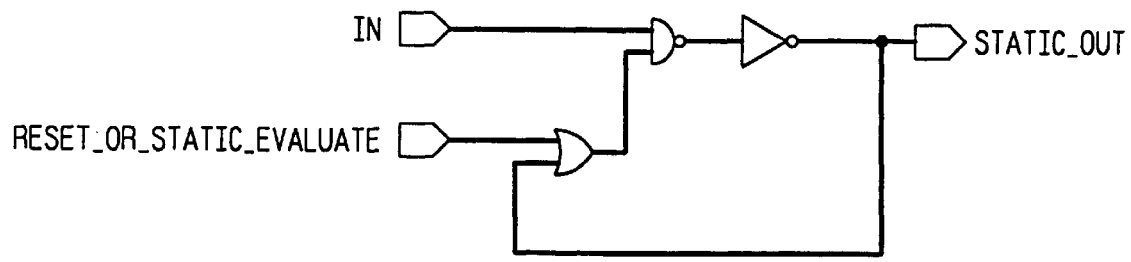
FIG. 11*b* is a simplified diagram of the circuit of FIG. 11*a*.

The circuit of FIG. 10 suffers from a small overlap current during the reset operation, when the series transistors Q3.10 and QR4 are overwhelming the small standby transistor QS2, before the output inverter of Q6 and Q7 has switched. This overlap current can be eliminated by adding an additional transistor Q8 in series with QS2, as shown in FIGS. 11a and 11b, where a transistor representation is shown in FIG. 11a and an equivalent gate representation (OAI (OR-AND-INVERT) I30), of this latter circuit is shown. However, the circuit of FIG. 10 is more area efficient, at a minimal cost in extra power dissipation, and presents less load to the Reset_or_Static_Evaluate driver.

Finally, to interface the input ports of circuit 201 of FIG. 12 with domino logic depends on the clocking scheme. If the last domino logic stage feeding into the input port is not reset until the transmission gate has closed, the interface is as simple as the static case: a simple inverter. If the last domino stage is reset before that time, a pulse catcher as described above is appropriate. All of these means can be implemented in the same circuit, as shown in FIG. 14.

Output sorts

Figure 14:
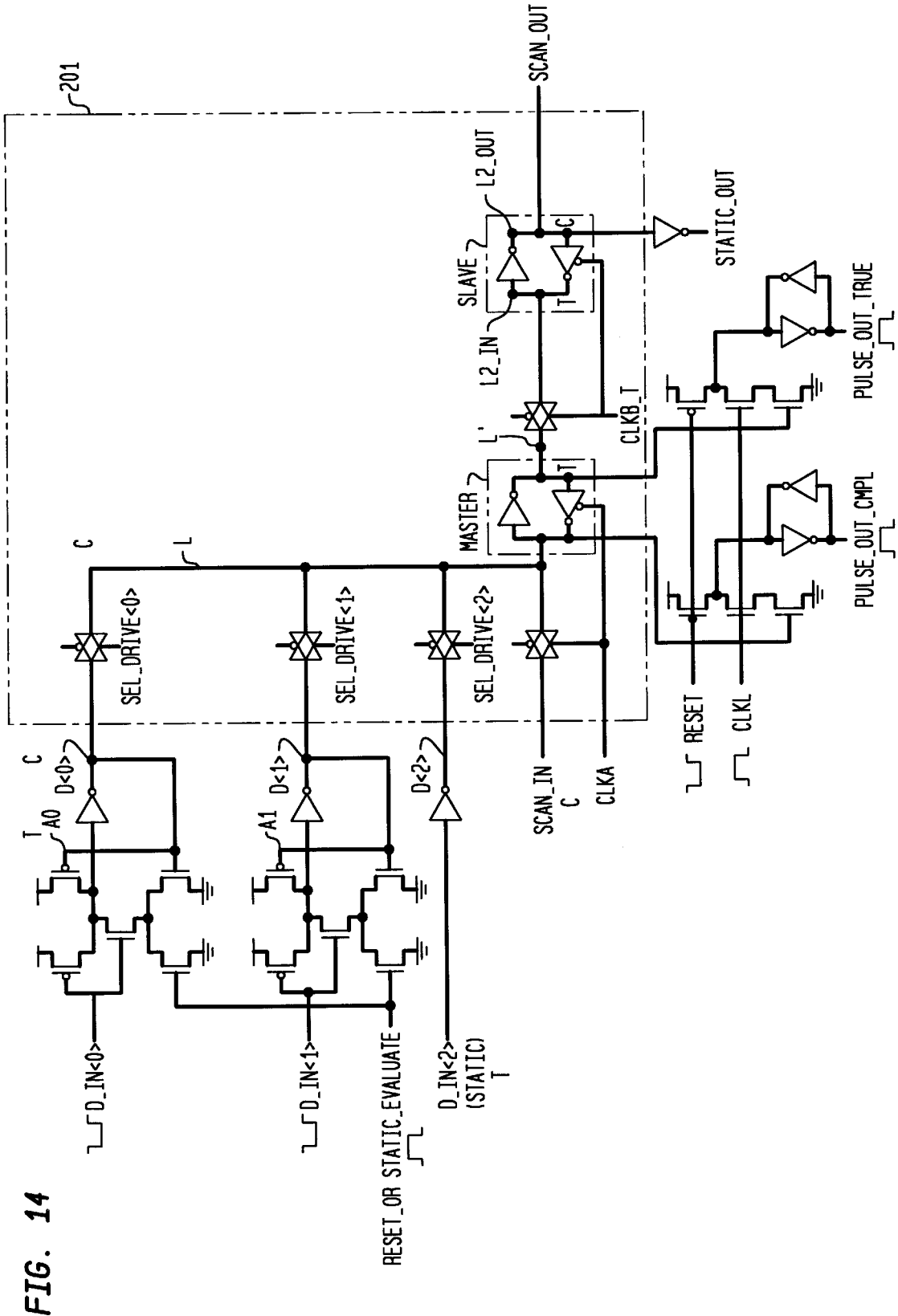
FIG. 14 is a schematic depiction of a register interfaced with static and pulsed logic.

There are many options to interface the register bit cell 201 of FIGS. 12–14 with static, domino or pulsed logic at the output.

To interface with static output logic merely requires connecting one or more inverters to either node L2_in or L2_out (FIG. 14), until the required output polarity and drive are achieved. T or C denotes true or complement polarity of the latch nodes.

To interface with domino output logic, node L2_in and/or L2_out can be directly routed into a gate in the n-tree of the first domino logic circuit down stream. Depending on the load, intervening buffers can be inserted until the required polarity and drive are achieved. See, e.g., FIG. 12, in which CLKL (the inverse of CLKL, as defined below) acts as the domino precharge clock. See Weste, et al. "Principles of CMOS VLSI Design: A system perspective", Addison Wesley, 1988, pp. 168–69, for a discussion of domino logic.

Finally, an interface with pulsed output logic requires connecting a pulsed output driver to either nodes L2_in and/or L2_out for "read-on-demand" output at any point in time mid-cycle, as in FIG. 13; or to either nodes L and/or L' for output at the beginning of the machine cycle, as in FIG. 14.

All these options can be mixed and matched as desired. As an example, a register bit cell 101 with two pulsed and one static input ports, and both a static and a dual-rail pulsed output port is given in FIG. 14.

Clocking circuitry and "Auto-sleep" function

In the register bit cells 201 of FIGS. 12–14, data are written into the master latch L1 by activation of one of the input ports. This usually occurs near the end of the machine cycle. Subsequently, at the system clock boundary, the data is transferred from the master latch L1 to the slave latch L2, by activation of the transmission gate I2 in FIG. 13. However, when nothing is written into the register in a particular machine cycle, that is, when the register is holding its state, there is no need to transfer information from the master latches to the slave latches at the next clock boundary. Activating the local transfer clock, CLKM, in such a situation amounts to wasting power.

Figure 16:
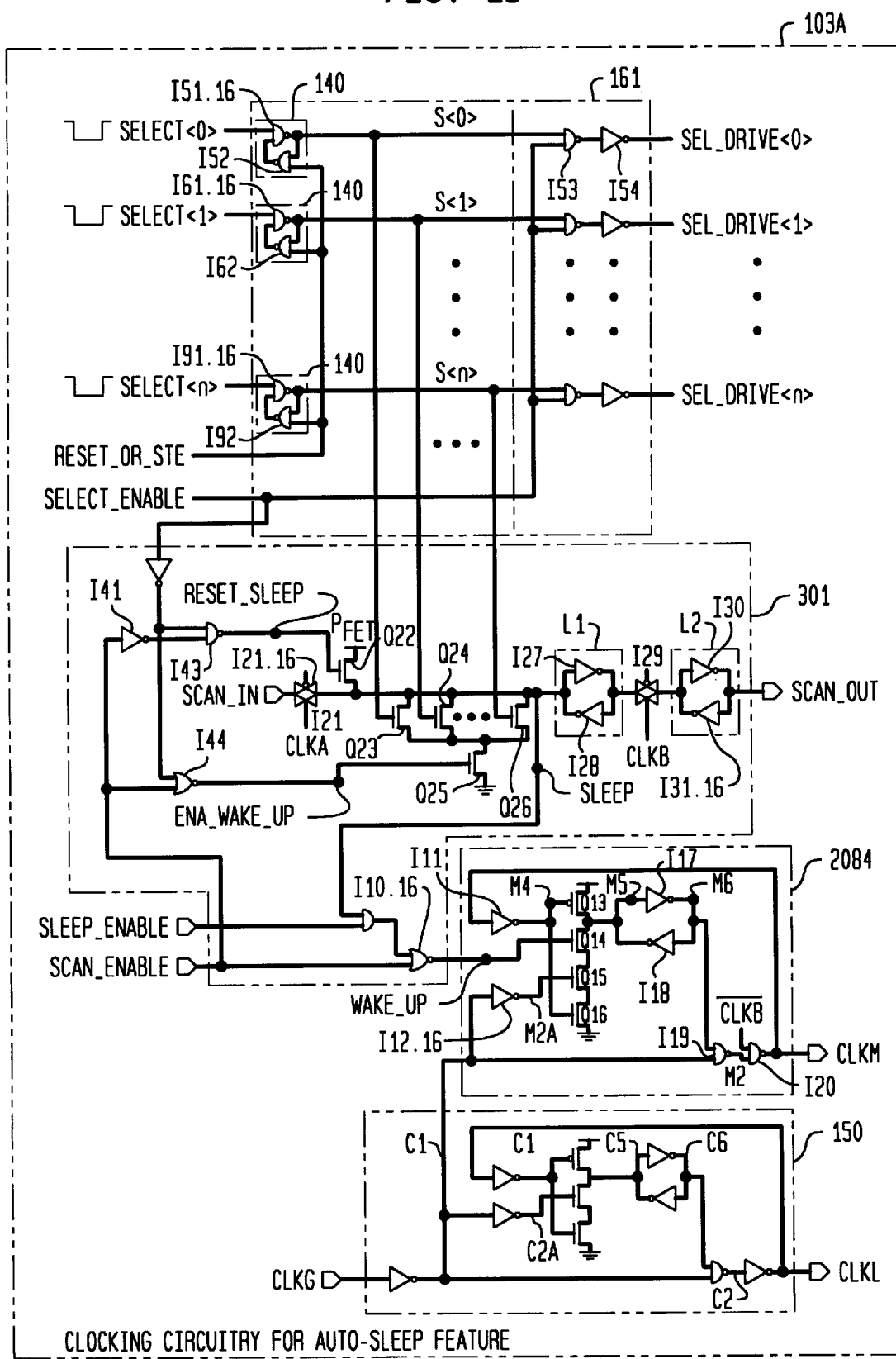
FIG. 16 is a detailed schematic diagram of the system of FIG. 15.

To address this issue, the present invention includes an auto-sleep latch, 301, as shown in FIG. 16. The auto-sleep latch 301 suppresses the launching of the CLKM pulse at the beginning of the cycle N when nothing is written into the register in cycle N-1.

Figure 15:
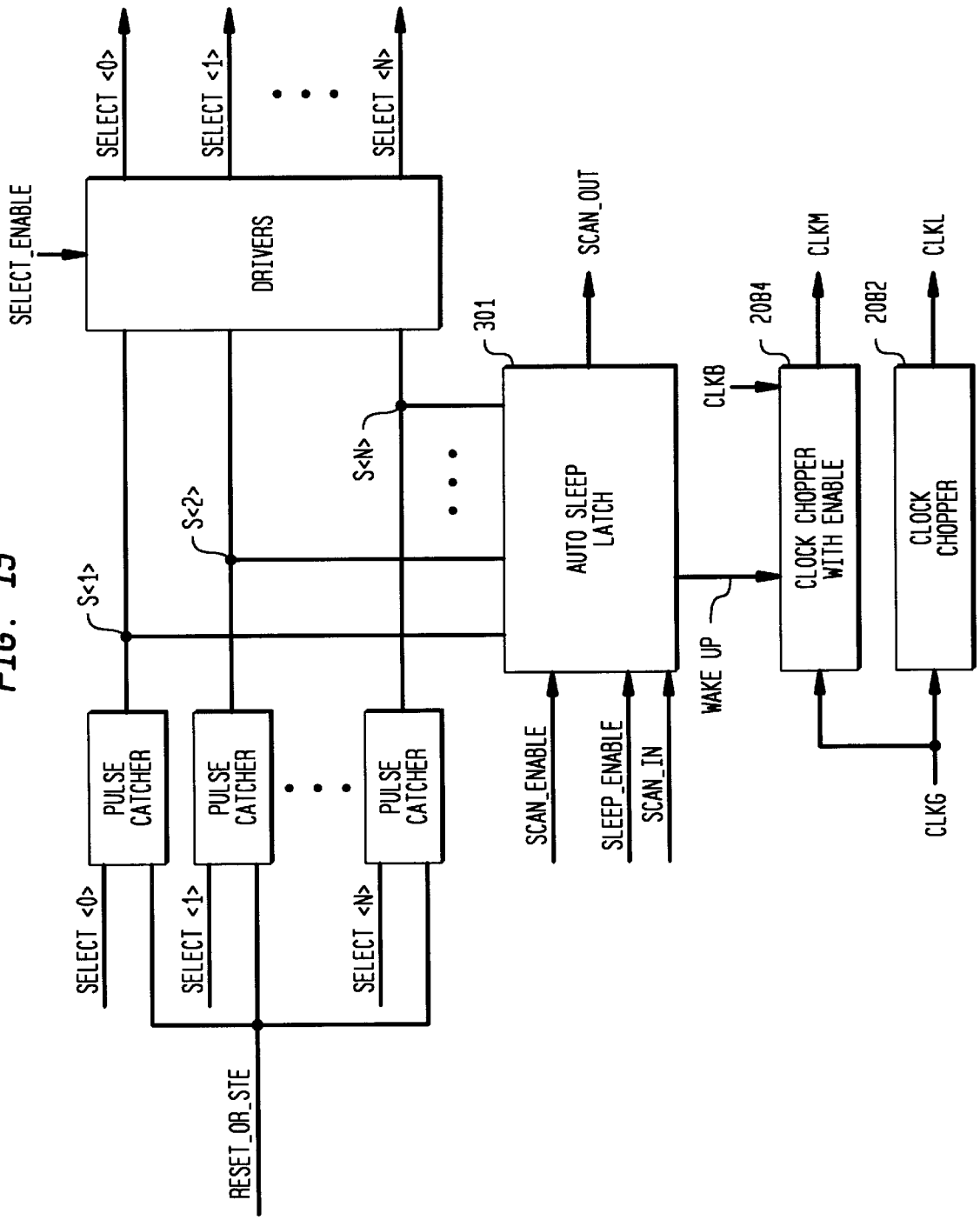
FIG. 15 is a blocked diagram depiction of an alternative embodiment of the present invention.

The register control section 103a of FIG. 16, with corresponding block diagram in FIG. 15, is very analogous to 103 to FIG. 6. In particular, it includes the same CLKL generator, 150. In addition, it includes the following features:

a) In normal operation, at the beginning of a machine cycle, the transfer clock pulse CLKM, generated by subcircuit 2084, is fired and reset. However, the clock is not subsequently re-armed. Instead, it is held in the reset state, or "sleep state", in which it cannot be fired again.

b) The status of the select inputs to the register input port multiplexer is monitored; only when a select input is activated, the "sleep state" is ended, and the clock is re-armed, so that it can fire again at the next cycle boundary. This is called the wake-up state; if there is no select input activated, the sleep state of the circuit 2084 persists and it cannot fire at the next cycle boundary.

c) Since the above wake_up or sleep state is a computed state which uses information of the previous cycle (select inputs active or inactive) to make a decision in the next cycle (fire/don't fire the transfer clock), the wake-up/sleep state is part of the machine state, and is therefore stored in a single bit latch. In the LSSD methodology, such a latch must be scannable. Circuitry to comply therewith is an optional part of this invention.

d) Circuitry to selectively disable the wake_up/sleep feature is another optional part of this invention. Omission thereof may improve the allowed set-up time of the select signals with respect to the system clock.

Figure 17:
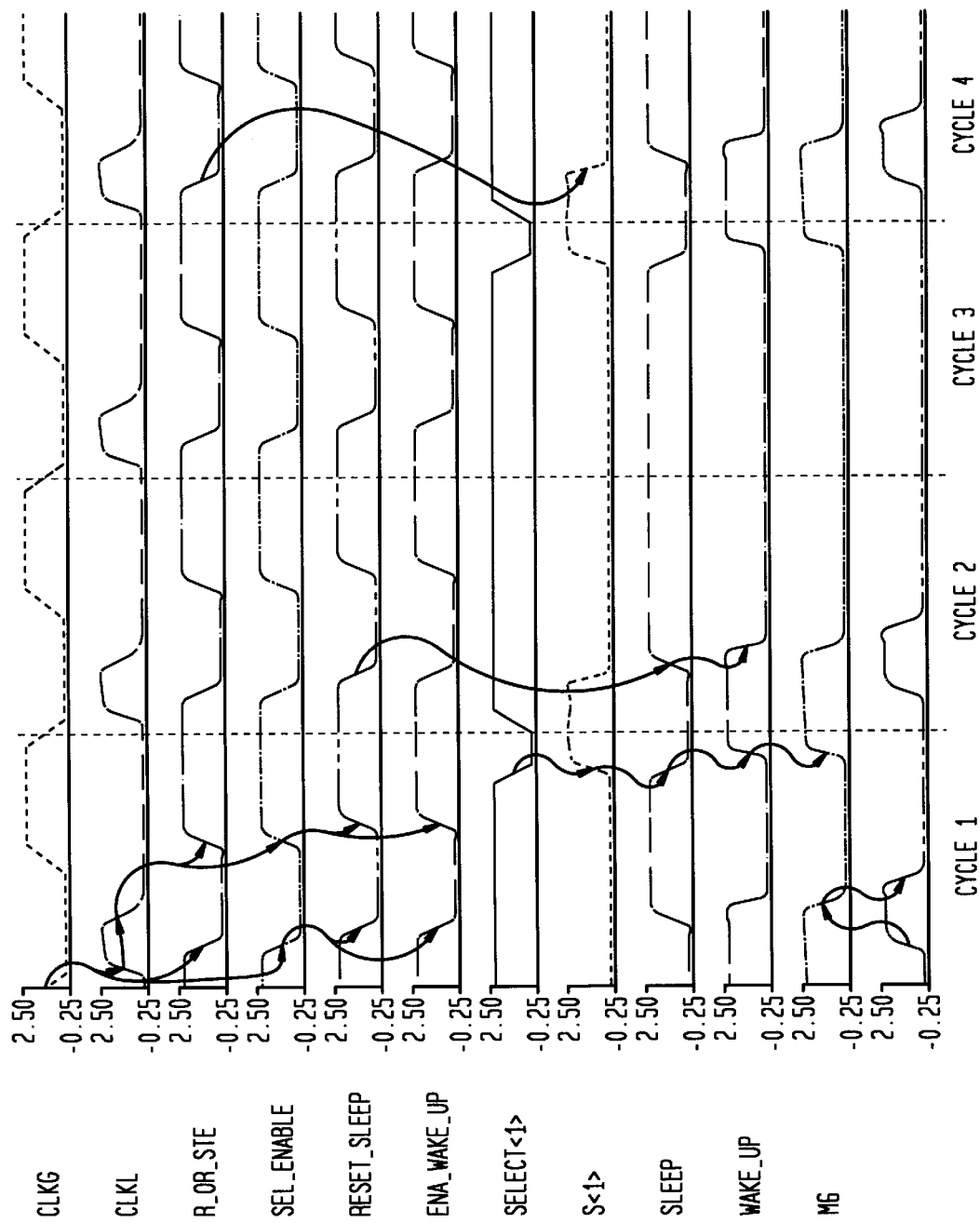
FIG. 17 is a waveform diagram depicting the operation of the circuit of FIG. 16.

The register control circuit 103a which includes the auto-sleep function is now described in detail with respect to FIG. 16 and the corresponding block diagram presentation in FIG. 15, with a corresponding timing diagram given in FIG. 17.

Figure 20:
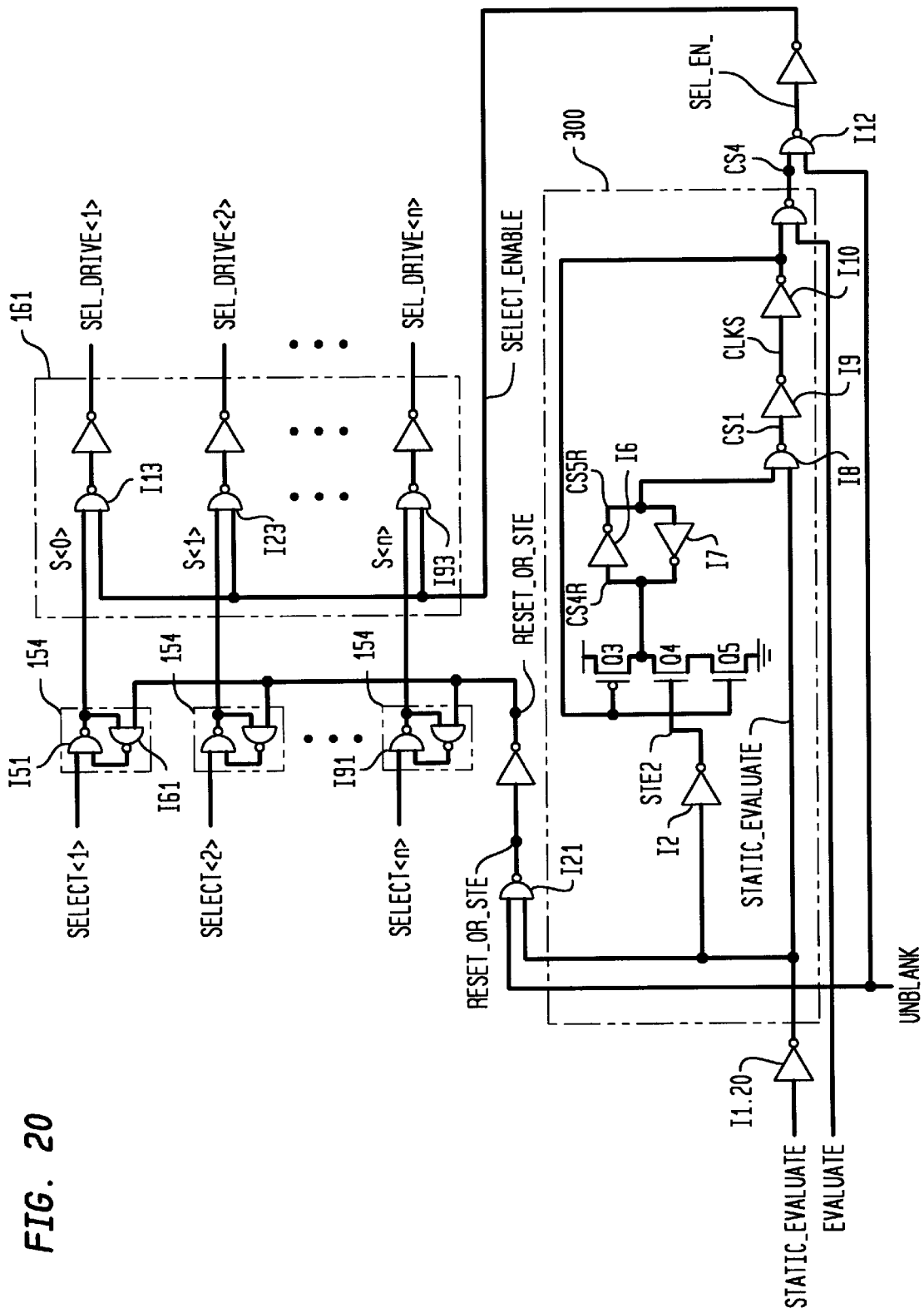
FIG. 20 is a schematic representation of the select-enable clock generator circuitry for a transmission-gate input register to make it comply with the static-evaluate mode of operation.

Omitted in FIG. 16, but identical to the circuitry 103 described in FIG. 6, are: 1) Select-Enable generator (144 in FIG. 6) and a test mode clock circuit 300, described in FIG. 20, which enable the input select driver circuitry 161 at some point mid-cycle and disable it at the beginning of the next cycle (thereby closing the data input transmission gates); 2) the ResetIn_or_StE pulse generator 152 for the data input pulse catcher circuits 131 described above; and 3) the circuitry to fire CLKL 150 and reset Reset_Out 152 data output drivers if so required as, e.g., in FIGS. 13 and 14.

The details of the circuitry to accomplish these functions are not shown here. See FIG. 6.

The register control circuit of FIG. 16 includes auto-sleep latch 301, clock chopper 150, clock chopper with enable 2084, pulse catchers 140 and select driver 161. Ill, I12.16, Q13 through Q16 and I17 through I20, constitute the clock chopper with enable circuit 2084 that is similar to the clock chopper 150. The output of circuit 2084, CLKM, drives the transfer gates I2 (FIG. 13) across the register bits. The essential differences between the circuits 150 and 2084 are the addition to the latter of transistor Q14 and gate I20.

After a CLKM pulse has fired and reset following an active low transition of CLKG, transistor Q14 inhibits the re-arming of the clock circuit, by keeping node M5 high, unless and until node Wake up goes high. Only then is M5 driven low and M6 high, re-arming the clock circuitry so that it can fire again at the next falling edge of CLKG.

Since in scan mode the firing of normal CLKM pulses is inhibited by gate I10.16 (which forces node Wake_up low while Scan_Enable is asserted), it is possible to logically OR in $\overline{\text{CLKB}}$ at gate I20, so that the CLKM output wire carries either CLKM pulses (parallel to CLKL pulses, but optionally sleeping), during normal functional operation, or CLKB pulses during scanning. In fact, CLKM can be effectively described as:

CLKM=<$\overline{\text{Scan\_Enable}}$>·<$\overline{\text{Sleep}}$>·CLKL+CLKB where it is understood that CLKB can only occur when Scan_Enable is active.

In general CLKM will be slightly delayed versus CLKL due to the necessary or-ing in of CLKB as described above. This performance decrease is acceptable as long as the slave latch static data outputs are not on a critical path. To slow down CLKM may even be attractive from a point of view of spreading of the clock load over time, reducing instantaneous switching current associated with the clock, and thereby reducing noise.

Q22, Q23, Q24, Q25, Q26, I27 and I28 implement a scannable 1 bit state latch that holds the computed sleep state of the register. This latch is reset through Q22 to the sleep state every cycle, at the beginning of the cycle, by Select_Enable (derived from CLKL) going low, activating node Reset_Sleep. When Select_Enable goes high again, at some (non-critical) time mid-cycle, Q22 is switched off, and Q25 is switched on, enabling the detection of an active select input.

The select inputs Select<0 . . . n> are shown as active low pulsed inputs, with the cross-coupled NANDs I51.16, I52, or I61.16, I62, or I91.16, I92 forming pulse catchers 140. These pulse catchers, driving only gates, do not need the high-drive output configuration of FIG. 10. Note that if (any of) the select inputs would be static, they could directly feed the S<0> . . . S<n> nodes.

If a pulse arrives on any of the Select<0 . . . n> inputs, the corresponding pulse catcher output node S<0> . . . S<n> goes active (high) and stays active until reset by Reset_or_Static_Evaluate.

Thus, a select pulse, that either has come in before or comes in after Enable_Wake_up goes high, causes one of Q23, Q24, . . . , Q26 to be activated, and the latch node Sleep is discharged. This then generates the Wake_up signal that re-arms the CLKM circuit, by discharging node M5 through Q14, Q15 and Q16.

The gates I41, I43 and I44 switch both Q22 and Q25 off when Scan_Enable is asserted, thereby allowing the Sleep latch 201 to participate in an LSSD scan chain (as depicted with devices I21, I29, I30 and I31.16). I43 and I44 are tuned such that Q22 and Q25 are never on at the same time.

As described above, gate I10 inhibits Wake_up while Scan_Enable is asserted, thereby inhibiting the firing of CLKM pulses during scanning. I10.16 also allows for optional disabling of the sleep/wake up feature by forcing Wake_up high if Sleep_Enable is brought low, (in functional mode, with Scan_Enable being low), thereby always re-arming the CLKM sub-circuit after firing, so that it will fire again in the next cycle.

The disabling of the auto-sleep feature in this way may allow for a shorter set-up time of the Select<0 . . . n> inputs, since it is no longer necessary that the Sleep and Wake up signals be generated before the next system clock (CLKG) edge.

On the other hand, the critical path that determines, e.g., the Select<0> set-up time is the amplification through the I53 and I54 drivers, distribution to the Sel<0> transmission gates in the register bits and (in FIG. 14) the propagation of the D<0> node to L' before CLKL hits, shortly after the CLKG edge. If this path is longer than the Wake_up path, there is no gain in disabling the auto-sleep feature, and Sleep_Enable can be eliminated.

In the timing diagram, FIG. 17, waveforms and their dependencies are indicated. In cycle 1 both CLKL and CLKM fire at the beginning of the cycle, and Sleep is reset to the sleep state, as described above. Once past mid-cycle, node Ena_Wake_up is high again, while the states of nodes S<0 . . . n> are being probed. When S<1> goes active, Sleep is discharged, enabling Wake_up and from there pulling M6 high, which enables I19 to fire CLKM at the beginning of cycle 2.

In cycle 2, no select input is activated towards the end of the cycle, therefore Sleep stays high, Wake_up low, and M6 low, inhibiting firing of CLKM at the beginning of cycle 3. CLKM is "automatically sleeping".

Towards the end of cycle 3, S<1> becomes active again, "waking up" the circuit so that M6 goes high and CLKM can fire again at the beginning of cycle 4.

Extension of Auto-sleep feature to external logic

If the static register with autosleep function as described drives combinatorial logic driven from a single register source, such as an incrementer, where the combinatorial logic is implemented in a dynamic logic family, the auto-sleep feature can be extended to the operation of this combinatorial logic. The logic is fired only if new information has been written in the register in the previous cycle, otherwise the logic keeps its output state, consistent with the output state of the register.

Figure 18:
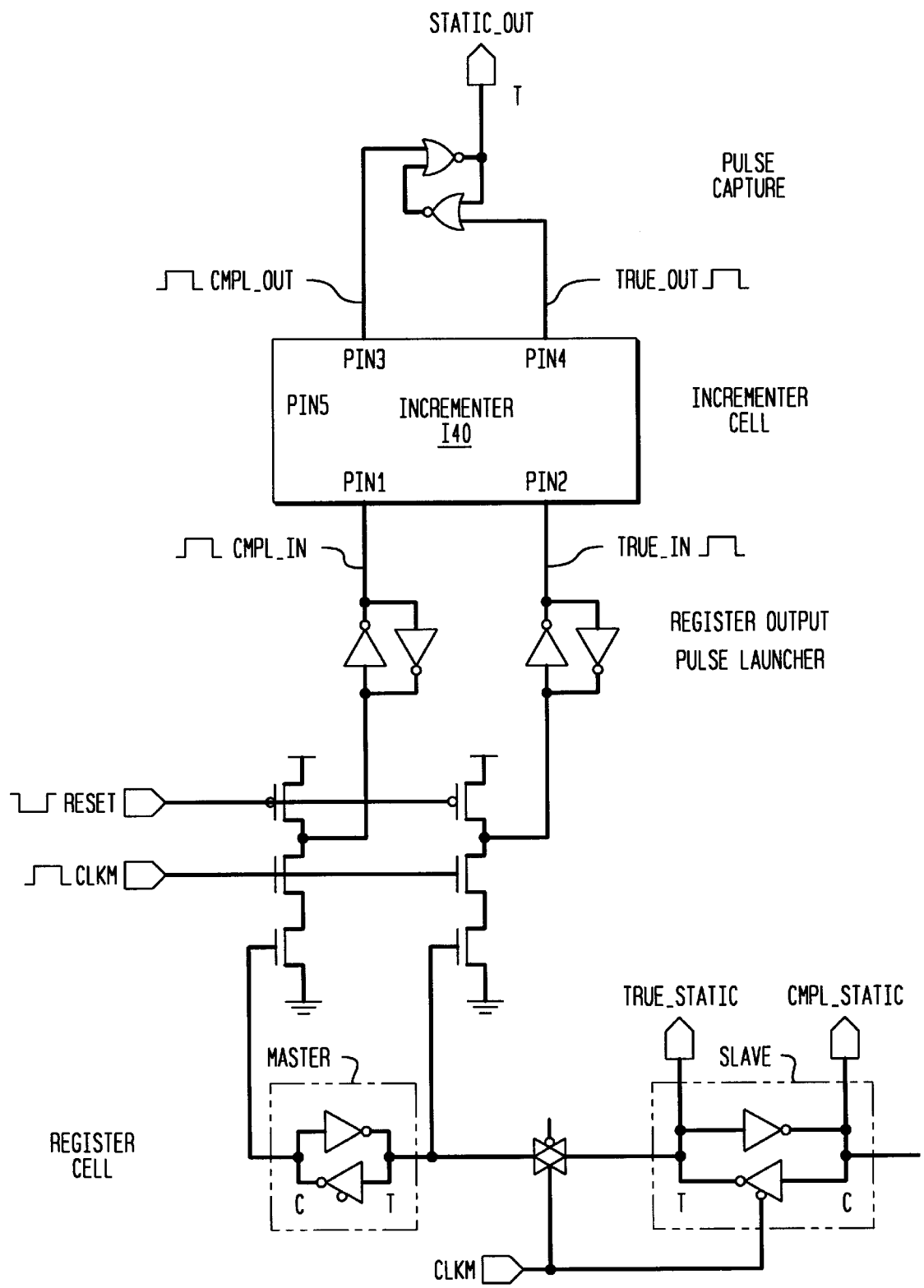
FIG. 18 is a schematic depiction of the extension of the auto-sleep concept for use in downstream self-resetting logic.

This is indicated in FIG. 18 for the case of self-resetting logic. If CLKM of FIGS. 16 and 17 is used as a pulse launching clock, then the logic will not be activated in sleep mode. Pulse-to-static converters at the output of the logic here implemented by cross-coupled NORs I51.16 and I52 keep the previously computed state, which is consistent with the output state of the register.

The timing follows the cycles of FIG. 17: In cycle 1, new information is written into the register. At the beginning of cycle 2, CLKM fires, and activates the pulsed data outputs of the register, thereby activating the combinatorial logic.

If in cycle 2 no new information is written into the register, CLKM will not fire in at the beginning of cycle 3. Hence, the combinatorial logic will not be activated in cycle 3. With the use of pulse catcher circuits at the outputs of the combinatorial logic, the output state attained in cycle 2 will keep throughout cycle 3.

Figure 19:
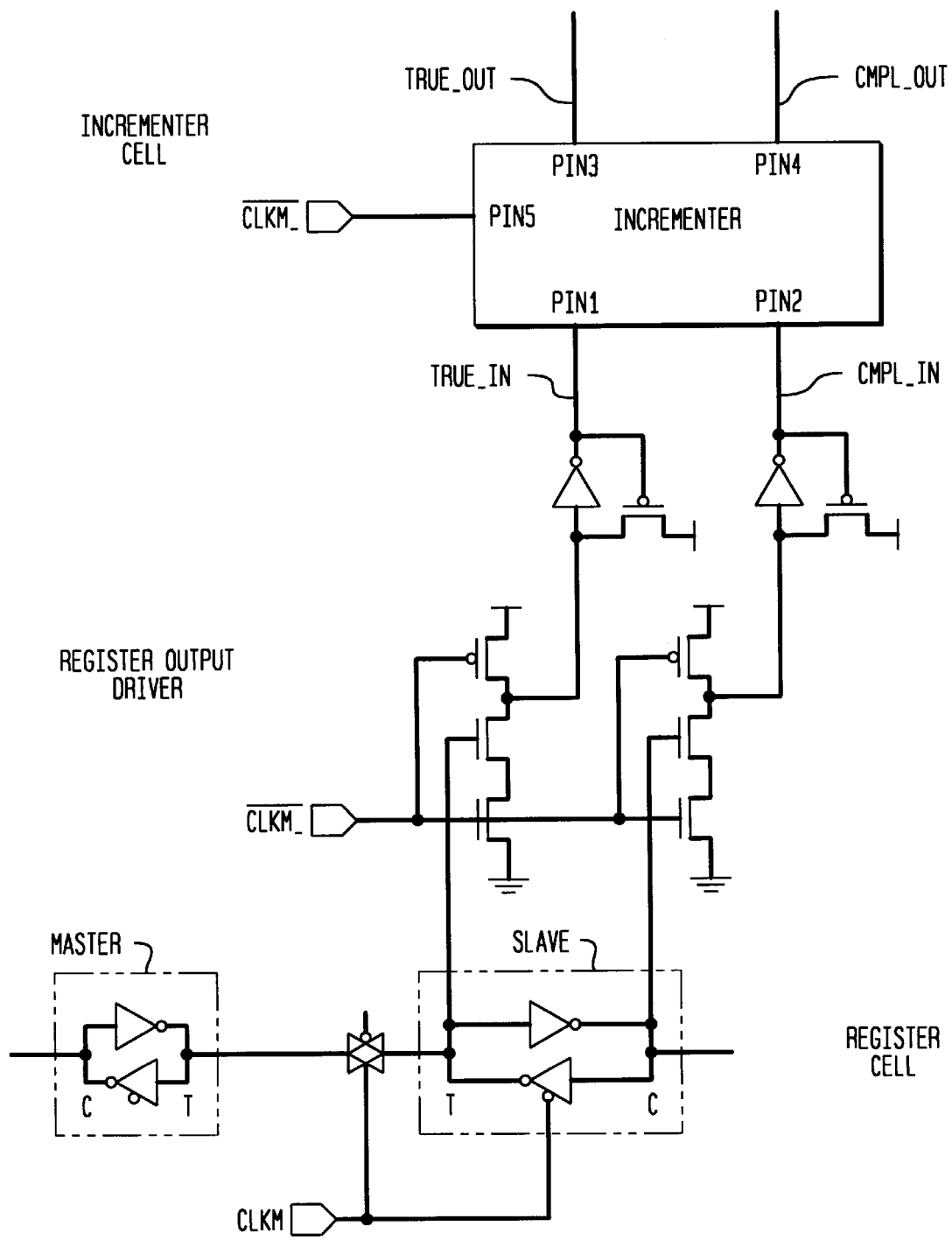
FIG. 19 is a schematic depiction of the extension of the auto-sleep circuitry for use in downstream domino logic.

FIG. 19 details the case for domino logic, in which $\overline{CLKM}$ acts as the precharge clock. Again, suppose that in cycle 1 new information is written into the register. At the beginning of cycle 2, CLKM therefore fires, and makes the new data visible at the combinatorial logic input. $\overline{CLKM}$ (inverted version of CLKM) now also acts as precharge clock for the combinatorial logic, as detailed for the output driver in FIG. 19. When the CLKM pulse falls, $\overline{CLKM}$ rises, and the combinatorial logic is activated.

If in cycle 2 no new information is written into the register, CLKM will not fire in at the beginning of cycle 3. Hence, the combinatorial logic will not be precharged, and will keep the state attained in cycle 2 throughout cycle 3.

Thereby the circuits of FIGS. 18 and 19 combine the low switching activity of static logic with the speed and glitch free behavior of dynamic logic.

LSSD compatibility of the Auto-Sleep Latch

Since the sleep or wakeup state of autosleep latch 301 is a computed state of the system, the autosleep latch must be scannable in order to comply with LSSD requirements. In FIG. 16, this is implemented by transmission gates I21 and I29 and the additional L2 latch, I30 and I31.16.

As a separate issue, the final scan_out output of a register macro usually has to be able to drive a substantial load, as the location of the next Scan_in input (of the next register in the scan chain) is undetermined. It is therefore undesirable to have the final Scan_out configured as in FIG. 14, since the Scan_out driver I3, which is only useful during scan mode, would also be switching according to the L2 latch data and CLKM in normal functional operation, thereby wasting power.

Hence, a circuit configuration is proposed in which the final scan_out driver is isolated from the rest of the register by a transmission gate that is only activated by the global CLKB signal. This is naturally implemented in FIG. 16, where the auto-sleep latch 301 functions as the last L1 latch in the scan chain, and the corresponding L2 latch (I30 and I31.16) is connected via gate I29, which is only activated by CLKB. Hence, the Scan_out signal of FIG. 16 will never switch in functional mode, only in scan mode. However, the general principle is more widely applicable: If, as in the present scheme, CLKB is combined into CLKM as a transfer clock between L1 and L2 latches, then it is advantageous to have a final L2 latch of the scan chain isolated and only switched by CLKB.

Operating Transmission Gate Input Registers in Compliance with

Static Evaluate Mode

A static transmission-gate input type bit cell 201, as in FIG. 14, can comply with the static evaluate mode of operation (wherein the signal Evaluate is active) by refraining from putting any select signal on the register bit 201 sel_drive lines until the point where data are supposed to be valid. This, by definition in this mode, is at the trailing edge of the Static_Evaluate pulse.

Delaying the activation of the register bit input control lines is accomplished by generating a clock pulse, called CLKS, from the trailing edge of Static_Evaluate. CLKS is then ANDed with the incoming primary select inputs (which are static levels in this mode).

In order to implement this function, we define the following logic for the Select_Enable signal driving select driver 161. In FIG. 16, logic for Select_Enable is given by the following statement:

$$\text{Select\_Enable} = \text{Unblank} \cdot (\overline{\text{Evaluate}} + \text{Evaluate} \cdot \text{CLKS})$$

-continued $$= \text{Unblank} \cdot (\overline{\text{Evaluate}} + \overline{CLKS})$$

where • stands for logical AND and +for logical OR. Select<i> is the (primary input) mix select signal, which originates from the external register control. "Unblank" is the output of a select_enable generator 144 as depicted in FIG. 6, but applied to FIG. 16.

Figure 21:
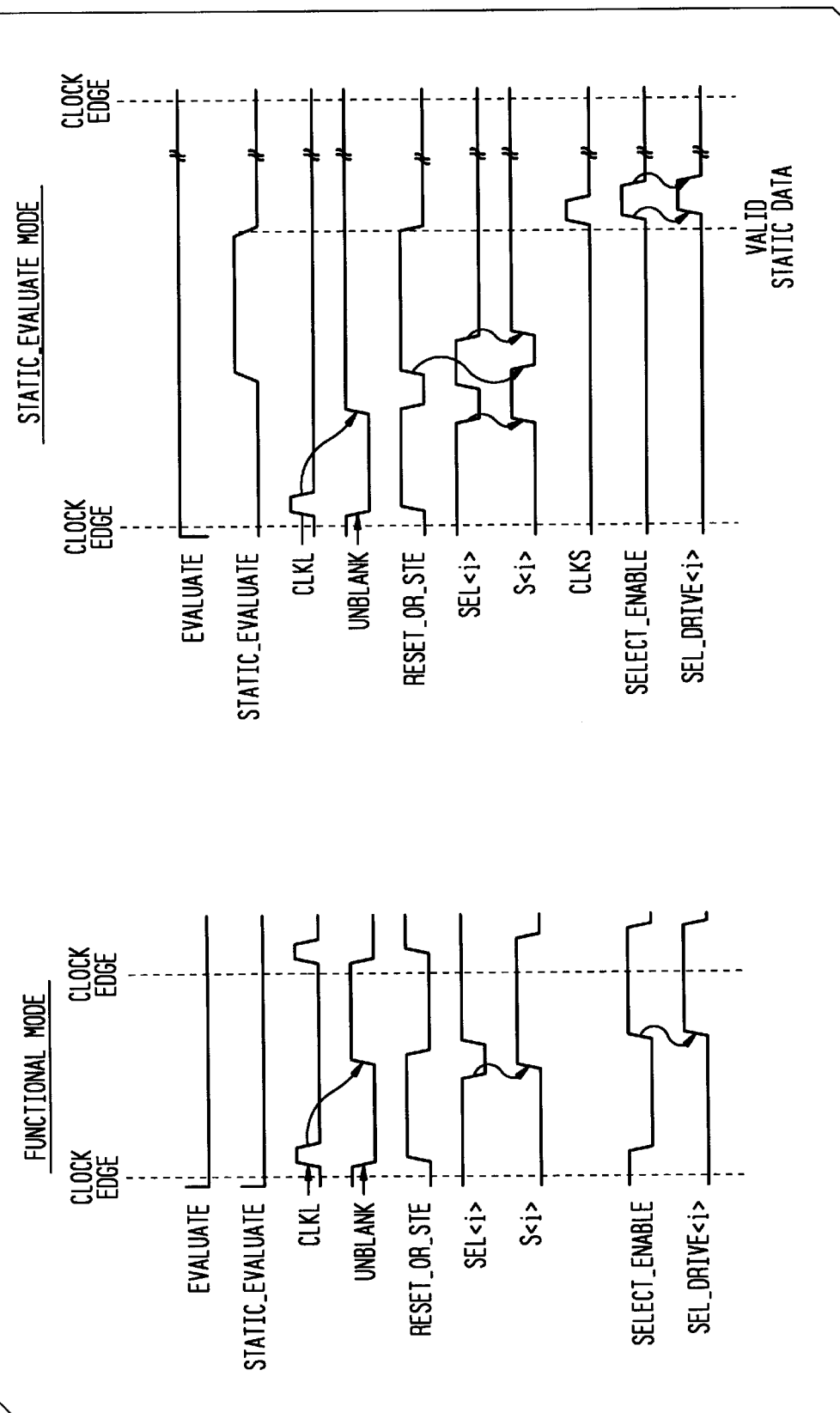
FIG. 21 is a waveform representation of the operation of the circuit of FIG. 20.

A preferred embodiment of the circuitry to implement this scheme is given in FIG. 20, with associated waveforms in FIG. 21. The circuit of FIG. 20 includes a select_drive circuit 161 that receives inputs from pulse catchers 154, as described above with respect to FIG. 16. A clock chopper 300 is also provided, and provides additional inputs to the multiplexer as now described.

In normal functional mode, primary inputs Evaluate and Static_Evaluate are inactive low. The active low input pulses Select<i> (for i=1 . . . n) are captured in the cross coupled NAND pulse catchers 154, which act as set-dominant pulse catchers. Hence, S<i> is a static, active high representation of the corresponding Select<i>.

Since "Evaluate" is low, node CS4 is high, and therefore Select_Enable directly follows Unblank. Select_Enable enables NANDs I13, I23,. . .I93, thereby driving the Sel_ drive<i> outputs, which drive the transmission gates 163 of FIGS. 12, 13, 14.

The S<i> nodes are reset at the beginning of the cycle using Reset_or_StE (the output of NAND gate I21 in FIG. 20), which, since Static_Evaluate is inactive low, also follows Unblank.

Hence, once a pulse has come in on one of the Select<i> inputs, the corresponding data input transmission gates 163 in the register bit cell 201 will open and stay open until Unblank goes inactive low ("Blank") at the beginning of the next cycle. Cycle time stretching is thus automatically accommodated.

In Static_Evaluate mode, on the other hand, the primary input Evaluate to NAND I11 is active high, thereby enabling transmission of CLKS through NAND gate Ill. Gates I1.20, I2, I6, I7, I8, I9, I10, Q3, Q4 and Q5 form a clock chopper ("one shot") circuit, which generates a pulse, CLKS, from the falling edge of primary input signal Static_Evaluate, which is derived from the global system clock in external logic. As long as CLKS, and hence node CS4 is low, Select_Enable cannot follow Unblank. Instead, Select_ Enable now becomes a pulse following CLKS, so that the state of the input S<i> is now driven onto the Sel_ drive<i>outputs only following CLKS. Notice again that Static_Evaluate mode uses a greatly expanded clock cycle, and that the CLKS pulse only comes long after Unblank has gone active high, enabling gate I12.

The Reset_or_StE signal now resets the S<i> nodes at the beginning of the cycle following Unblank going low, but also follows the later Static Evaluate pulse. While Static_ Evaluate is active high, Reset_or_StE is high, which has the effect that I51, I61, . . . I91 are essentially reduced to inverters. In this phase, therefore, the S<i> nodes follow the primary Select<i> inputs, thereby recovering from false switching events, as depicted in FIG. 21.

As described before, the trailing edge of Static_Evaluate is shifted out in time such that all glitches on the chip have settled. This implies that the now static Select<i> signal has settled to its final value. Only then is CLKS fired, and a data input transmission gate 163 of FIGS. 12, 13, 14 is activated if the corresponding Select<i> has settled in its active state.

It is noted that in static evaluate mode, the registers are written following CLKS, which in this mode forms an L1 clock that is non-overlapping with the CLKM signal in FIG. 21. CLKM is derived very early in the cycle from the system clock edge, and which functions as the master-slave transmission clock (L2 clock) in the register bit cell 101 of FIGS. 12, 13, 14. Hence, in this test mode, the static master slave register described is a true non-transparent (race free) master-slave design, providing further insulation against (and therefore diagnosis of) timing hazards.

What is claimed:

1. A system, comprising:
    a) a data register having a data input line and a data output line;
    b) an input multiplexer having one or more bit select lines, one or more data input lines and a data output line connected to the input of the data register;
    c) the data register comprising a clock generation circuit for producing a local clock pulse to control the latching-in of data into the register;
    d) means for inhibiting the clock generation circuit from producing the local clock pulse when no data is to be latched-in to the register; and
    e) means for capturing pulsed data applied to the data input lines, storing the pulsed data, and launching the data on the output lines.

2. The system of claim 1, further comprising means for capturing static data applied to the data input lines, and for storing the static data.

3. The system of claim 1, wherein the launched data is pulsed data.

4. The system of claim 2, wherein the launched data is pulsed data.

5. The system of claim 1, further comprising:
    means for scanning a datum into the latch from the output of a second latch and for scanning the datum out of the latch to the input of a third latch.

6. The system of claim 5, wherein the scanning means is compliant with the level sensitive scan design methodology.

7. The system of claim 1, wherein the inhibiting means is responsive to the state of the bit select lines.

8. The system of claim 7, wherein the inhibiting means further comprises override means for setting the clock generation circuit to its non-inhibited state regardless of the state of the bit select lines.

9. The system of claim 5, further comprising means for combining the local clock signal with a scan clock signal used by the scanning means.

10. The system of claim 1, wherein the data register is self-resetting.

11. The system of claim 1, wherein the launched data is static data.

12. The system of claim 1, wherein the data output line of the register is coupled to provide a data input to a dynamic circuit.

13. The system of claim 1, wherein the means for capturing pulsed data comprises a pulse catcher coupled to more or more of the data input lines of the multiplexer, each pulse catcher having means for receiving pulsed data signals and producing a static signal to be applied to the multiplexer.

14. The system of claim 13, wherein the pulse catcher includes a reset input, and means responsive to the reset signal for producing a standby signal for application to the multiplexer.

15. The system of claim 14, wherein the pulse catcher comprises means, when a reset signal and an incoming data pulse overlap, for producing an output corresponding to the data pulse.

16. The system of claim 1, wherein the output of the register is coupled to one or more buffering devices.

17. The system of claim 9, wherein the register further comprises a scan output line, and a scan output driver coupled to receive the signals on the scan output line in response to a scan clock and to convey the signals on the scan output line to downstream circuitry.

18. The system of claim 1, further comprising means for producing pulsed and static output data signals.

19. A system, comprising:
a) a data register having a data input line and a data output line;
b) an input multiplexer having one or more bit select lines, one or more data input lines and a data output line connected to the input of the data register;
c) the data register comprising a clock generation circuit for producing a local clock pulse to control the latching-in of data into the register;
d) means for capturing pulsed data applied to the data input lines, storing the pulsed data, and launching the data on the output lines; and
e) static evaluate test mode means, comprising:
means for recovering from false evaluations during an evaluation phase of the static evaluate test mode;
means for latching data into the register at the end of the evaluation phase;
means for holding an output signal evaluated and stable for a desired duration.

20. The system of claim 1, further comprising a register control circuit coupled to provide select signals and control signals to the data register, the control circuit comprising:
means for deriving signals from a local clock signal to control: the launching of pulsed data outputs from the register, the resetting of pulsed data outputs at the output of the register, the transmission of static data outputs from the register, the resetting of bits represented by the register, the resetting of pulse catchers at the data input of the register and the enabling/disabling of the data input multiplexers.

21. The system of claim 20, wherein the register control circuit comprises means for forcing the register and the control circuit into a reset state in response to a global reset signal.

22. The system of claim 20, wherein the register control circuit comprises means responsive to a global signal for inhibiting the reset of the output of the register.

23. The system of claim 20, wherein the register control circuit further comprises means for synchronizing transitions between scan mode and functional mode operation of the register.

24. The system of claim 20, wherein the register control circuit further comprises means for inhibiting during scan operations the resetting of data latched into the register.

25. The system of claim 22, wherein the register control circuit further comprises means operable during a static evaluate mode of operation for initiating the reset of pulsed combinational logic downstream of the register, the means for inhibiting comprising means for forcing the resetting of pulsed data output drivers at the output of the register in response to a global reset signal at the conclusion of the static-evaluate mode.

26. The system of claim 1, further comprising means for delaying the application of register input select signals to the select lines in a static evaluate mode of operation until the static levels of the input select signals are valid.

27. The system of claim 1, wherein the inhibited local clock is used to drive or inhibit downstream logic.

28. A system, comprising:
a) a self-resetting data register having a data input line and a data output line;
b) an input multiplexer having one or more bit select lines, one or more data input lines and a data output line connected to the input of the data register;
c) the data register comprising a clock generation circuit for producing a local clock pulse to control the latching-in of data into the register;
d) means for capturing data applied to the data input lines, storing the data, and launching pulsed data on the output lines.

29. The system of claim 28, further comprising means for capturing static data applied to the data input lines, and for storing the static data.

30. The system of claim 28, further comprising:
means for scanning a datum into the latch from the output of a second latch and for scanning the datum out of the latch to the input of a third latch.

31. The system of claim 30, wherein the scanning means is compliant with the level sensitive scan design methodology.

32. The system of claim 28, further comprising means for inhibiting the clock generation circuit from producing the local clock pulse when no data is to be latched-in to the register.

33. The system of claim 32, wherein the inhibiting means is responsive to the state of the bit select lines.

34. The system of claim 32, wherein the inhibiting means further comprises override means for setting the clock generation circuit to its non-inhibited state regardless of the state of the bit select lines.

35. The system of claim 30, further comprising means for combining the local clock signal with a scan clock signal used by the scanning means.

36. The system of claim 35, wherein the register further comprises a scan output line, and a scan output driver coupled to receive the signals on the scan output line in response to a scan clock and to convey the signals on the scan output line to downstream circuitry.

37. The system of claim 28, further comprising means for producing pulsed and static output data signals.

38. A system, comprising:
a) a data register having a data input line and a data output line;
b) an input multiplexer having one or more bit select lines, one or more data input lines and a data output line connected to the input of the data register;
c) the data register comprising a clock generation circuit for producing a local clock pulse to control the latching-in of data into the register;
d) means for capturing data applied to the data input lines, storing the data, and launching pulsed data on the output lines; and
e) static evaluate test mode means, comprising:
means for recovering from false evaluations during an evaluation phase of the static evaluate test mode;
means for latching data into the register at the end of the evaluation phase;

means for holding an output signal evaluated and stable for a desired duration.

39. The system of claim 28, further comprising a register control circuit coupled to provide select signals and control signals to the data register, the control circuit comprising:
   means for deriving signals from a local clock signal to control: the launching of pulsed data outputs from the register, the resetting of pulsed data outputs at the output of the register, the transmission of static data outputs from the register, the resetting of bits represented by the register, the resetting of pulse catchers at the data input of the register and the enabling/disabling of the data input multiplexers.

40. The system of claim 39, wherein the register control circuit comprises means for forcing the register and the control circuit into a reset state in response to a global reset signal.

41. The system of claim 39, wherein the register control circuit comprises means responsive to a global signal for inhibiting the reset of the output of the register.

42. The system of claim 39, wherein the register control circuit further comprises means for synchronizing transitions between scan mode and functional mode operation of the register.

43. The system of claim 39, wherein the register control circuit further comprises means for inhibiting during scan operations the resetting of data latched into the register.

44. The system of claim 41, wherein the register control circuit further comprises means operable during a static evaluate mode of operation for initiating the reset of pulsed combinational logic downstream of the register, the means for inhibiting comprising means for forcing the resetting of pulsed data output drivers at the output of the register in response to a global reset signal at the conclusion of the static-evaluate mode.

45. The system of claim 28, further comprising means for delaying the application of register input select signals to the select lines in a static evaluate mode of operation until the static levels of the input select signals are valid.

46. The system of claim 32, wherein the inhibited local clock is used to drive or inhibit downstream logic.

\* \* \* \* \*